(12) United States Patent
Kim et al.

(10) Patent No.: US 9,935,161 B2
(45) Date of Patent: Apr. 3, 2018

(54) DISPLAY PANEL AND METHOD FOR MANUFACTURING THE SAME

(71) Applicant: Samsung Display Co., Ltd., Yongin-si, Gyeonggi-Do (KR)

(72) Inventors: Jungyeon Kim, Suwon-si (KR); Eonseok Oh, Seongnam-si (KR); Woosik Jeon, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/346,564

(22) Filed: Nov. 8, 2016

(65) Prior Publication Data

US 2017/0352707 A1    Dec. 7, 2017

(30) Foreign Application Priority Data

Jun. 1, 2016  (KR) .................. 10-2016-0068368

(51) Int. Cl.
  *H01L 29/20*    (2006.01)
  *H01L 33/00*    (2010.01)
  *H01L 27/32*    (2006.01)

(52) U.S. Cl.
  CPC .......... *H01L 27/326* (2013.01); *H01L 27/322* (2013.01); *H01L 27/3246* (2013.01)

(58) Field of Classification Search
  CPC .. G02F 1/0316; G02F 1/134309; G02F 1/155; G02F 2001/1357; G02F 2001/136295; G02F 1/0121; G02F 1/0327; G02F 1/076; G02F 1/13306; G09G 3/3659; G09G 3/3655; H01J 61/0672; H01J 61/0732; H01L 25/048; H01L 25/065; H01L 25/0652; H01L 25/0655; H01L 25/0657; H01L 51/0032–51/0095; H01L 51/5004; H01L 27/3211–27/3218; H01L 27/3202; H01L 51/5221–51/5234;

(Continued)

(56) References Cited

U.S. PATENT DOCUMENTS 8,895,969 B2    11/2014    Kim et al.
2016/0118626 A1    4/2016    Seo et al.

FOREIGN PATENT DOCUMENTS

JP    2014-225416 A    12/2014
WO    WO 2009/154288 A1    12/2009

OTHER PUBLICATIONS

EPO Extended Search Report dated Nov. 2, 2017, for corresponding European Patent Application No. 17173826.3 (11 pages).

*Primary Examiner* — Sonya D McCall Shepard
(74) *Attorney, Agent, or Firm* — Lewis Roca Rothgerber Christie LLP

(57) ABSTRACT

A display panel including first and second sub pixel electrodes, a first light emitting unit, first and second charge generation layers, a second light emitting unit, and an upper electrode. The first light emitting unit is provided with a first contact hole. The first charge generation layer includes a first contact part being in the first contact hole and coupled to a portion of the first sub pixel electrode exposed by the first contact hole, and a first extension part extending from the first contact part and being on the first light emitting unit. The second charge generation layer and the second light emitting unit are provided with a second contact hole. The upper electrode includes a first upper electrode part being in the second contact hole and coupled to a second contact part of the second charge generation layer exposed by the second contact hole.

26 Claims, 20 Drawing Sheets

(58) Field of Classification Search
CPC .................. H01L 51/5206–51/5218; H01L 51/5072–51/5084; H01L 51/5056–51/5068; H01L 51/5088–51/5092; H01L 51/504–51/5044; H01L 27/32; H01L 27/3204; H01L 27/3206; H01L 27/3209; H01L 27/3213; H01L 27/3216
See application file for complete search history.

DISPLAY PANEL AND METHOD FOR MANUFACTURING THE SAME

CROSS-REFERENCE TO RELATED APPLICATION

This patent application claims priority to and the benefit of Korean Patent Application No. 10-2016-0068368, filed on Jun. 1, 2016, the entire content of which is hereby incorporated by reference.

BACKGROUND

One or more aspects of embodiments of the present disclosure herein relates to a display panel and a method for manufacturing the same, and more particularly, to a display panel having improved efficiency and a method for manufacturing the same.

Organic light emitting devices may be self-emitting devices that have a wide viewing angle and superior contrast. In addition, organic light emitting devices may have a rapid response time, high brightness, and low driving voltage.

An example organic light emitting device includes an anode and a cathode, and a hole transporting layer, a light emitting layer, and an electron transporting layer, which are successively disposed (e.g., positioned) on the anode, between the anode and the cathode. For example, the hole transporting layer, the light emitting layer, and the electron transporting layer may be organic thin films, each of which is formed of an organic compound.

When different voltages are respectively applied to the anode and the cathode of the organic light emitting device, holes injected from the anode move to the light emitting layer via the hole transporting layer, and electrons injected from the cathode move to the light emitting layer via the electron transporting layer. The holes and the electrons are then coupled in the light emitting layer to generate excitons. The excitons return from an excited state to a ground state to generate light.

SUMMARY

One or more aspects of embodiments of the present disclosure are directed toward a display panel having improved efficiency and a method for manufacturing the same.

An embodiment of the inventive concept provides a display panel that may include: a base substrate; a first sub pixel electrode on the base substrate; a second sub pixel electrode on the base substrate and spaced apart from the first sub pixel electrode when viewed in plane; a first light emitting unit on the first and second sub pixel electrodes, the first light emitting unit being provided with a first contact hole; a first charge generation layer including a first contact part and a first extension part extending from the first contact part, the first contact part being in the first contact hole and being coupled to a portion of the first sub pixel electrode exposed by the first contact hole, and the first extension part being on the first light emitting unit; a second charge generation layer on the first light emitting unit and overlapping the second sub pixel electrode when viewed in plane, the second charge generation layer being insulated from the first charge generation layer; a second light emitting unit on the first and second charge generation layers, the second light emitting unit and the second charge generation layer together being provided with a second contact hole; and an upper electrode including a first upper electrode part and a second upper electrode part extending from the first upper electrode part, the first upper electrode part being in the second contact hole and being coupled to a second contact part of the second charge generation layer exposed by the second contact hole, and the second upper electrode part being on the second light emitting unit.

In an embodiment, when viewed in plane, the first and second charge generation layers may be spaced apart from each other.

In an embodiment, when viewed in a cross-section, the first and second charge generation layers may be on the same layer.

In an embodiment, when viewed in plane, the first extension part may overlap the second upper electrode part.

In an embodiment, the display panel may further include a pixel defining layer configured to cover a portion of the first sub pixel electrode, wherein at least a portion of the first extension part may be on the pixel defining layer.

In an embodiment, the first contact part may be directly coupled to a portion of the first sub pixel electrode.

In an embodiment, the second light emitting unit between the first extension part and the second upper electrode part may be configured to generate an electric field, and the second light emitting unit may be configured to generate light after being excited by the electric field, and the first extension part may be configured to have substantially the same potential as the first sub pixel electrode.

In an embodiment, the second charge generation layer may further include a second extension part extending from the second contact part to overlap the second sub pixel electrode when viewed in plane.

In an embodiment, when viewed in plane, the second upper electrode part may overlap the second extension part.

In an embodiment, the display panel may further include a pixel defining layer configured to cover a portion of the second sub pixel electrode, wherein at least a portion of the second extension part may be on the pixel defining layer.

In an embodiment, an inclined surface of the second contact part exposed by the second contact hole, may be directly coupled to the first upper electrode part.

In an embodiment, the first light emitting unit between the second extension part and the second sub pixel electrode may be configured to generate an electric field, and the first light emitting unit may be configured to generate light after being excited by the electric field, and the second upper electrode part may be configured to have substantially the same potential as the second extension part.

In an embodiment, the display panel may further include a third sub pixel electrode disposed to be spaced apart from the first and second sub pixel electrodes when viewed in plane, wherein the second charge generation layer may further include a third extension part extending from the second contact part to overlap the third sub pixel electrode when viewed in plane.

In an embodiment, the display panel may further include first and second color filters respectively configured to transmit light having colors different from each other, wherein, when viewed in plane, the first color filter may overlap the first sub pixel electrode, and when viewed in plane, the second color filter may overlap the second sub pixel electrode.

In an embodiment, the display panel may further include an auxiliary line between the second contact part and the base substrate, wherein the first upper electrode part may be coupled to the auxiliary line through the second contact hole.

In an embodiment, the display panel may further include a fourth sub pixel electrode spaced apart from the first to third sub pixel electrodes when viewed in plane and a third charge generation layer overlapping the fourth sub pixel electrode when viewed in plane, wherein the third charge generation layer may be insulated from the first and second charge generation layers and may be between the first and second light emitting units.

In an embodiment, at least one of the first and second charge generation layers may include one or more inorganic materials selected from Ag, Mg, Yb, Al, Ca, Li, and Cs.

In an embodiment of the inventive concept, a method for manufacturing a display panel includes: providing a first sub pixel electrode on a base substrate; providing a second sub pixel electrode on the base substrate and spaced apart from the first sub pixel electrode when viewed in plane; providing first light emitting unit on the first and second sub pixel electrodes; providing a first contact hole in the first light emitting unit to expose the first sub pixel electrode; providing a first charge generation layer on the first light emitting unit and the first sub pixel electrode and coupling the first sub pixel electrode to the first charge generation layer through the first contact hole; providing a second charge generation layer on the first light emitting unit and spaced apart from the first charge generation layer when viewed in plane; providing a second light emitting unit on the first and second charge generation layers; providing a second contact hole in the second light emitting unit and the second charge generation layer; and providing an upper electrode in the second contact hole and on the second light emitting unit and coupling a portion of the second charge generation layer exposed by the second contact hole to the upper electrode through the second contact hole.

In an embodiment, the method may further include providing a third sub pixel electrode on the base substrate, wherein the third sub pixel electrode may be spaced apart from the first and second sub pixel electrodes when viewed in plane.

In an embodiment, the method may further include: providing a fourth sub pixel electrode on the base substrate; and providing a third charge generation layer overlapping the fourth sub pixel electrode, wherein the fourth sub pixel electrode may be spaced apart from the first to third sub pixel electrodes when viewed in plane, and the third charge generation layer may be insulated from the first and second charge generation layers and may be between the first and second light emitting units.

In an embodiment, when the electric field is generated in the second light emitting unit, the electric field may not be substantially generated in the first light emitting unit.

In an embodiment, wherein when the electric field is generated in the first light emitting unit, the electric field may not be substantially generated in the second light emitting unit.

In an embodiment, the display panel may further include a pixel circuit layer on the base substrate and a first insulation layer on the pixel circuit layer, wherein the third sub pixel electrode may be coupled to the pixel circuit layer through a contact hole provided in the first insulation layer.

In an embodiment, the auxiliary line and the second contact hole may be between the second and third sub pixel electrodes, or the auxiliary line and the second contact hole may be between the third sub pixel electrode and an edge of the display panel.

In an embodiment, the first charge generation layer may include a lower charge generation layer and an upper charge generation layer, wherein at least one of the lower and upper charge generation layers may be an N-type charge generation layer, and the other one of the lower and upper charge generation layers may be a P-type charge generation layer.

In an embodiment, the first and second charge generation layers may be configured to supply electrons and/or holes to the second and first light emitting units, respectively.

BRIEF DESCRIPTION OF THE DRAWINGS

The accompanying drawings are included to provide a further understanding of the present disclosure, and are incorporated in and constitute a part of this specification. The drawings illustrate example embodiments of the inventive concept and, together with the description, serve to explain principles of the inventive concept. In the drawings.

DETAILED DESCRIPTION

Figure 1:
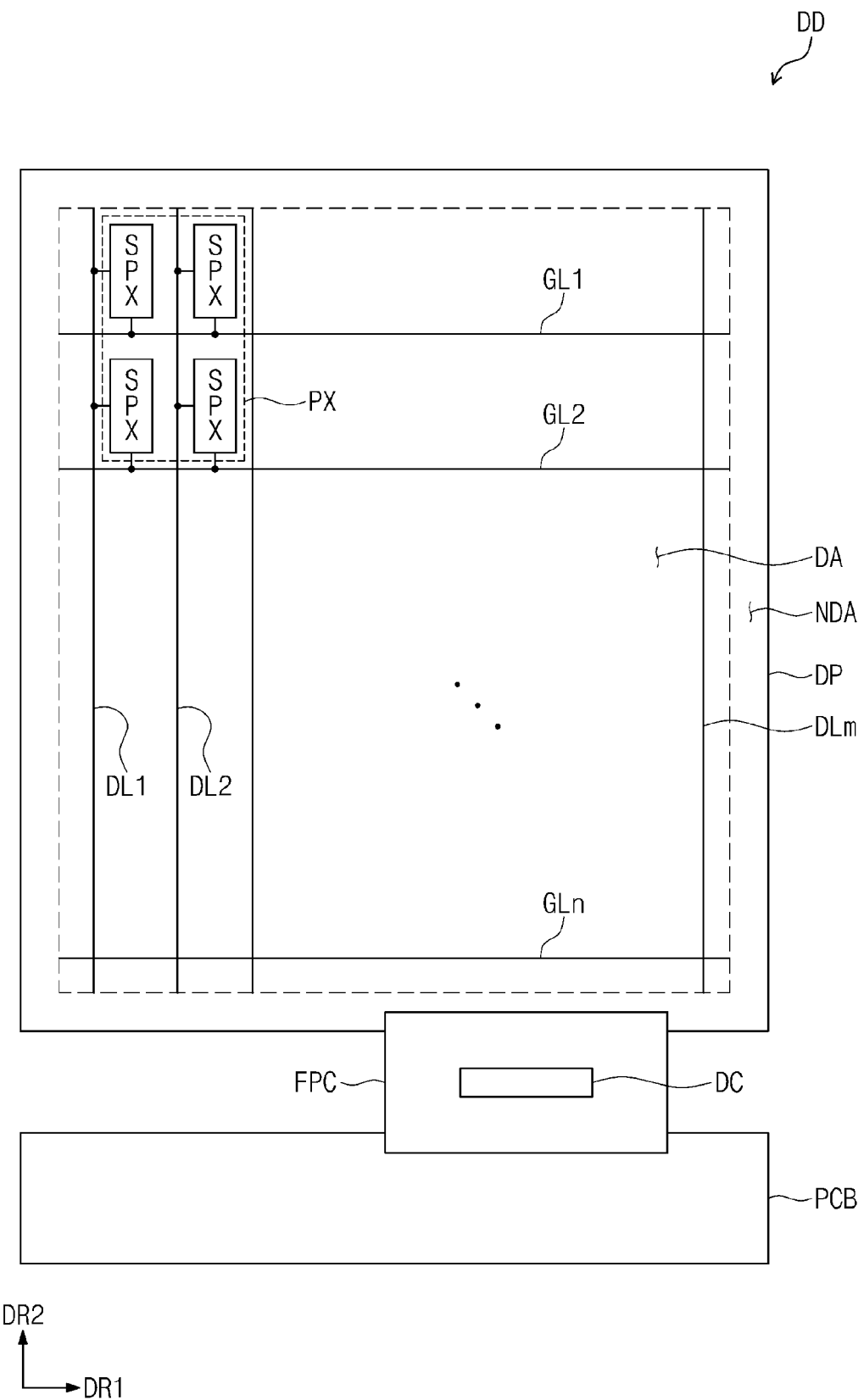
FIG. 1 is a schematic plan view of a display device according to an embodiment of the inventive concept.

While specific embodiments of the present disclosure have been illustrated in the drawings and are described in the detailed description of the inventive concept, the present disclosure is not limited to the specific described embodiments, and it should be understood that the present disclosure covers all the modifications, equivalents, and replacements within the idea and technical scope of the inventive concept.

Like reference numerals refer to like elements throughout. In the drawings, the dimensions and size of each structure may be exaggerated, omitted, and/or schematically illustrated for convenience of description and clarity. When one or more components (e.g., elements) are similar, these components may be given similar names, and in this case, a description with respect to one component may also be applied to the other component(s) having the name similar to that of the first component.

It will be understood that although the terms "first" and "second" are used herein to describe various elements, these elements should not be limited by these terms. The terms are only used to distinguish one component from other components. For example, an element referred to as "a first element" in one embodiment can be referred to as "a second element" in another embodiment, without departing from the scope of the present disclosure and appended claims. The terms of a singular form may include plural forms unless stated otherwise.

The terms "include" and "comprise," when used in this specification, may refer to the presence of a property, a region, a fixed number, a step, a process, an element and/or a component but do not exclude other properties, regions, fixed numbers, steps, processes, elements and/or components. In the specification, it will be understood that when a layer (or film), a region, and/or a plate is referred to as being "on" another layer, region, and/or plate, it can be directly on the other layer, region, and/or plate, or intervening layer(s), region(s), and/or plate(s) may also be present. It will be understood that when a layer (or film), a region, and/or a plate is referred to as being "under" another layer, region, and/or plate, it can be directly under the other layer (or film), region, and/or plate, or intervening layer(s), region(s), and/or plate(s) may also be present.

Example embodiments of the inventive concept will be described below in more detail with reference to the accompanying drawings.

FIG. 1 is a schematic plan view of a display device according to an embodiment of the inventive concept.

Referring to FIG. 1, a display device DD according to an embodiment of the inventive concept includes a display panel DP, a flexible circuit board FPC, and a printed circuit board PCB.

The display panel DP may display an image through a display area DA. The display area DA may be driven by a control signal and image data, which are provided from the printed circuit board PCB.

The display panel DP may include gate lines GL1 to GLn, data lines DL1 to DLm, and sub pixels SPX, which are disposed (e.g., positioned) in the display area DA. For example, the gate lines GL1 to GLn may be arranged with each other along a second direction DR2 and may each independently extend in a first direction DR1. The data lines DL1 to DLm cross the gate lines GL1 to GLn and are insulated from the gate lines GL1 to GLn. For example, the data lines DL1 to DLm may be arranged with each other along the first direction DR1 and may each independently extend in the second direction DR2. In the specification, a "plane" may refer to a plane (e.g., a surface) that is defined by the two axes represented by the first and second directions DR1 and DR2 (e.g., DR1-DR2 plane). When a surface is said to extend in a "horizontal direction," it may extend in a direction parallel to the plane. As used herein, "viewed in the plane" or "viewed in plane" may refer to a two-dimensional plan view point of reference.

In an embodiment of the inventive concept, when viewed in the plane, a non-display area NDA of the display panel DP may surround the display area DA. The sub pixels SPX are not disposed in the non-display area NDA, and thus, the non-display area NDA does not display an image. The non-display area NDA may be defined as a bezel of the display device DD (e.g., as an element between the display area DA and the edge of the display device DD).

Each of the sub pixels SPX is connected (e.g., electrically coupled) to a corresponding gate line of the gate lines GL1 to GLn and a corresponding data line of the data lines DL1 to DLm.

The sub pixels SPX may be arranged in a matrix form along the first and second directions DR1 and DR2 (e.g., in the DR1-DR2 plane). The sub pixels SPX may be configured to display one of primary colors such as red, green, and/or blue color. However, the colors capable of being displayed by the sub pixels SPX are not limited to the red, green, and the blue colors. The sub pixels SPX may display various colors, for example, secondary primary colors such as a white color, a yellow color, a cyan color, and/or a magenta color, in addition to the red, green, and/or blue colors.

The sub pixels SPX may together constitute a pixel PX. For example, four sub pixels SPX may constitute one pixel PX. However, an embodiment of the inventive concept is not limited thereto. For example, two, three, or more sub pixels SPX may constitute one pixel PX.

The pixel PX may be a device for displaying a unit image. The resolution of the display panel DP may be determined according to the number of pixels PX provided on the display panel DP. While only one pixel PX is illustrated in FIG. 1 for convenience of explanation, the display device of the present embodiments may include any suitable number of pixels.

In an embodiment of the inventive concept, the display panel DP may be an organic light emitting display panel. Each of the sub pixels SPX may include an organic light emitting layer.

For example, the display panel DP may have a pair of long sides, which are parallel to the second direction DR2, and a pair of short sides parallel to the first direction DR1 and perpendicular to and extending between the pair of long sides. In an embodiment of the inventive concept, the display panel DP may have a plate shape. However, embodiments of the inventive concept are not limited thereto, and the display panel DP may vary in shape. For example, the display panel DP may have an edge that is curved in at least one direction when a cross-section of the display panel DP is viewed or has a rounded shape when the display panel DP is viewed in the plane.

The flexible circuit board FPC may connect (e.g., couple) the display panel DP to the printed circuit board PCB. Although one flexible circuit board FPC is illustrated in FIG. 1, embodiments of the inventive concept are not limited thereto. For example, a plurality of flexible circuit boards FPC may be provided, and the plurality of flexible circuit boards FPC may be arranged along an edge of the display panel DP and may extend in one direction. In an embodiment of the inventive concept, the number of flexible circuit boards FPC may variously change.

In an embodiment of the inventive concept, the flexible circuit board FPC may include a driving chip DC. The driving chip DC may be mounted on the flexible circuit board FPC in the form of, for example, a tape carrier package (TCP). The driving chip DC may include a chip that provides for a data driver. The driving chip DC may further include a chip that provides for a gate driver. Also, the gate driver may be disposed within the non-display area NDA.

The printed circuit board PCB may include a control unit for controlling the display panel DP. The control unit receives input image signals and converts data format of the input image signals to match interface specifications of the data driver, the gate driver, and the display panel DP, thereby generating the image data. The control unit outputs the image data and the control signal. The image data may include information with respect to an image to be displayed on the display area DA.

The data driver receives each of the image data and the control signal. The data driver converts the image data into data voltages in response to the control signal, to output the data voltages to the data lines DL1 to DLm. The data voltages may be analog voltages corresponding to the image data.

Various electronic devices that realize (e.g., utilize) the control unit may be mounted on the printed circuit board PCB. For example, the printed circuit board PCB may include active devices such as a microprocessor and/or a memory chip and lines connecting the active devices to each other, as well as passive devices such as a capacitor and/or a resistor.

Figure 2:
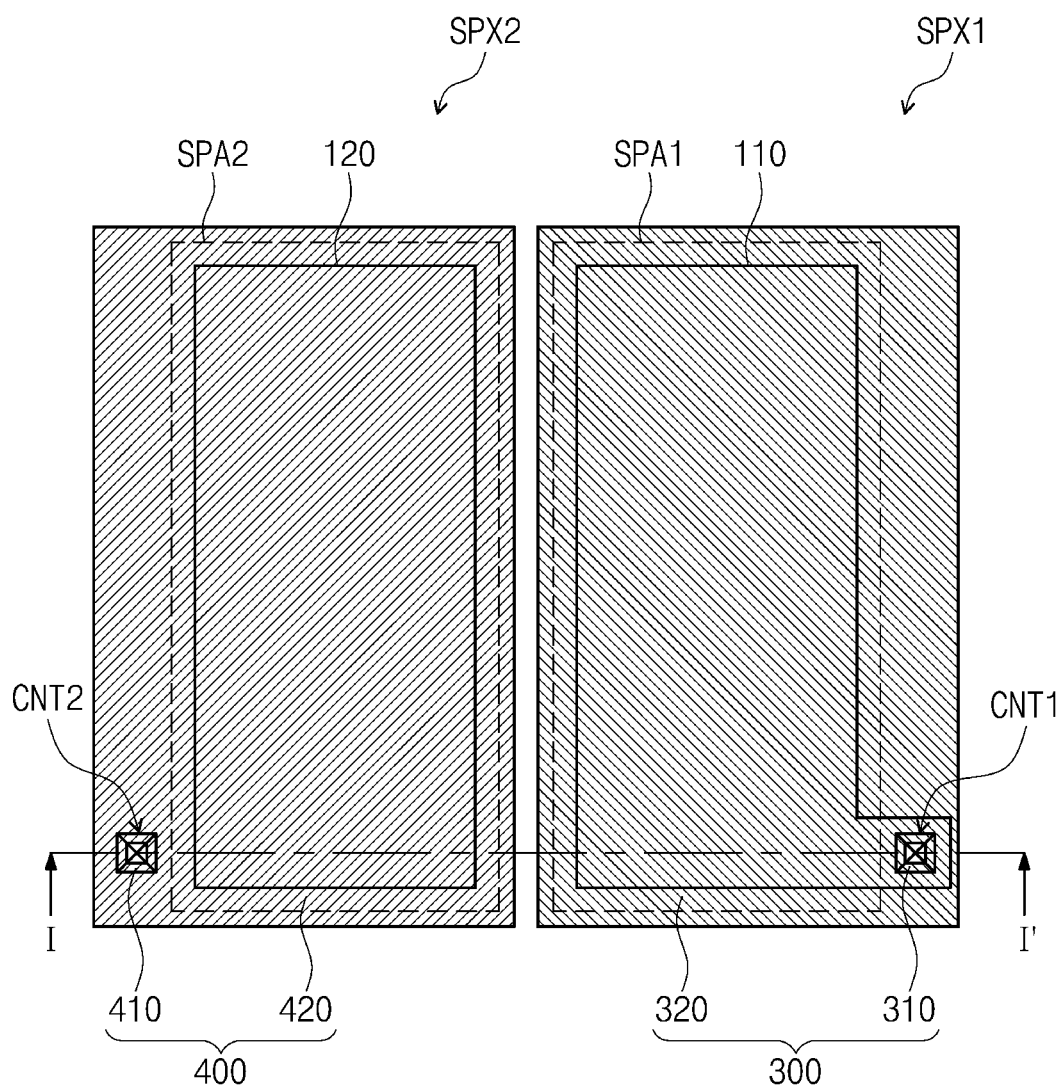
FIG. 2 is a schematic plan view of pixels according to an embodiment of the inventive concept.
Figure 3:
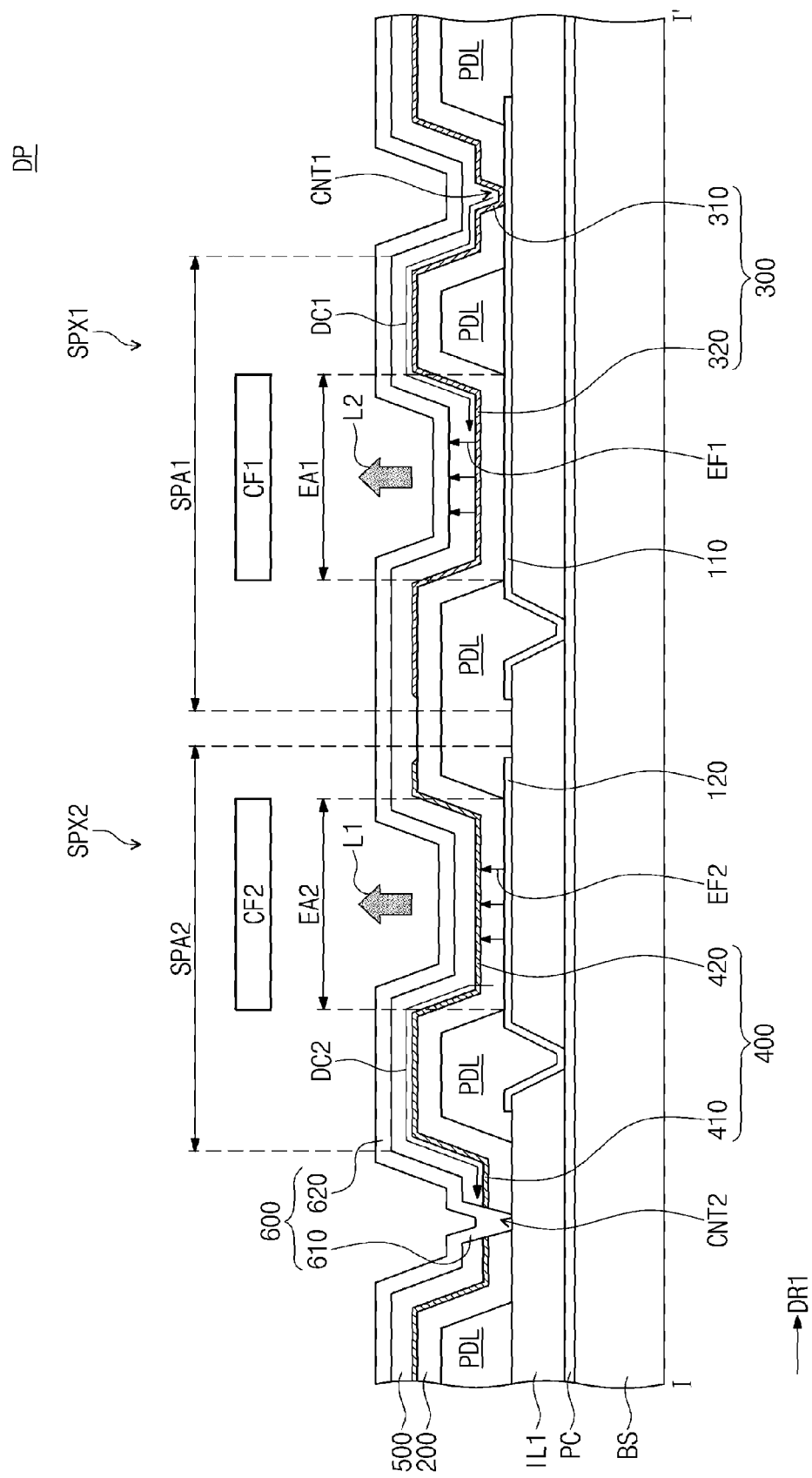
FIG. 3 is a cross-sectional view taken along line I-I' of FIG. 2.

FIG. 2 is a schematic plan view of the pixel according to an embodiment of the inventive concept, and FIG. 3 is a cross-sectional view taken along line I-I' of FIG. 2.

Referring to FIG. 2, the pixel PX according to an embodiment of the inventive concept may include first and second sub pixels SPX1 and SPX2. The first and second sub pixels SPX1 and SPX2 may be examples of the sub pixels SPX illustrated in FIG. 1.

In an embodiment of the inventive concept, the first and second sub pixels SPX1 and SPX2 may be a blue sub pixel and a green sub pixel, respectively. Each of the first and second sub pixels SPX1 and SPX2 may have an approximately rectangular (e.g., substantially rectangular) shape and may be arranged with each other along the first direction DR1.

Referring to FIG. 3, in an embodiment of the inventive concept, the display panel DP may include a base substrate BS, a pixel circuit layer PC, a first insulation layer IL1, a first sub pixel electrode 110, a second sub pixel electrode 120, organic layers disposed on the first and second sub pixel electrodes 110 and 120, and an upper electrode 600 disposed on the organic layers. In an embodiment of the inventive concept, the organic layers may include a first light emitting unit 200, a first charge generation layer 300, a second charge generation layer 400, and a second light emitting unit 500.

In an embodiment of the inventive concept, the layers (e.g., the base substrate BS, the pixel circuit layer PC, the first insulation layer IL1, the first sub pixel electrode 110, the organic layers, and the upper electrode 600) of the display panel DP that are disposed within a first sub pixel area SPA1 when the display panel DP is viewed in the plane, may constitute the first sub pixel SPX1, and the layers of the display panel DP that are disposed within a second sub pixel area SPA2 may constitute the second sub pixel SPX2.

In an embodiment of the inventive concept, the base substrate BS may be transparent, for example, may be formed of or may include rigid glass and/or a polymer having flexibility.

In an embodiment of the inventive concept, the pixel circuit layer PC may be disposed on an entire top surface of the base substrate BS (e.g., the pixel circuit layer PC may entirely cover the top surface of the base substrate BS). The pixel circuit layer PC may include, for example, at least two or more transistors. The pixel circuit layer PC may include, for example, a switching transistor that is turned on in response to an applied gate signal to transmit a data voltage, and a driving transistor supplying driving current corresponding to the data voltage received from the switching transistor to the first light emitting unit 200.

The first insulation layer IL1 may be disposed on substantially an entire top surface of the pixel circuit layer PC. The first insulation layer IL1 may include contact holes through which a portion of the pixel circuit layer PC is exposed. The first insulation layer IL1 may have a single-layer or a multi-layer structure, and may include an organic material and/or an inorganic material.

In an embodiment of the inventive concept, the first and second sub pixel electrodes 110 and 120 may be disposed on the first insulation layer IL1 and spaced apart from each other in the first direction DR1. Portions of the first and second sub pixel electrodes 110 and 120 may be disposed in the corresponding contact holes of the first insulation layer IL1 to directly contact the pixel circuit layer PC and thus independently receive the driving current from the pixel circuit layer PC.

The display panel DP may further include a pixel defining layer PDL. The pixel defining layer PDL may be disposed on, for example, the first and second sub pixel electrodes 110 and 120 and the first insulation layer IL1. The pixel defining layer PDL may cover portions (e.g., edges) of the first and second sub pixel electrodes 110 and 120, while leaving portions of the first and second sub pixel electrodes 110 and 120 exposed (e.g., not covered by the pixel defining layer PDL).

In an embodiment of the inventive concept, the first light emitting unit 200 may be disposed on the pixel defining layer PDL and the first and second sub pixel electrodes 110 and 120. The first light emitting unit 200 may generate, for example, first light having a first color.

In an embodiment of the inventive concept, the first charge generation layer 300 may be disposed on the first light emitting unit 200 to overlap the first sub pixel electrode 110 when viewed in the plane. The first charge generation layer 300 may be disposed between the first and second light emitting units 200 and 500 to supply charges (e.g., electrons and/or holes) to the first and second light emitting units 200 and 500 of the first sub pixel SPX1 and to adjust (e.g., improve) a balance of the supplied charges. In this specification, "the first and second light emitting units 200 and 500 of the first sub pixel SPX1" may refer to portions of the first and second light emitting units 200 and 500 positioned within the first sub pixel area SPA1. Hereinafter, other components of the first and second sub pixels SPX1 and SPX2 may be indicated by using expressions similar thereto.

The first charge generation layer 300 may include a first contact part 310 and a first extension part 320. The first contact part 310 may be connected (e.g., coupled) to the first sub pixel electrode 110 through a first contact hole CNT1 defined in the first light emitting unit 200.

In an embodiment of the inventive concept, the second charge generation layer 400 may be disposed on the first light emitting unit 200 to overlap the second sub pixel electrode 120 when viewed in the plane. The second charge generation layer 400 may be disposed between the first and second light emitting units 200 and 500 to supply charges (e.g., electrons and/or holes) to the first and second light emitting units 200 and 500 of the second sub pixel SPX2, and may adjust (e.g., improve) a balance of the supplied charges. The second charge generation layer 400 may be, for example, spaced apart from the first charge generation layer 300 in the first direction DR1 and insulated from the first charge generation layer 300.

The second charge generation layer 400 may include a second contact part 410 and a second extension part 420. The second contact part 410 may be connected (e.g., coupled) to the upper electrode 600 through a second contact hole CNT2 defined in the first light emitting unit 200, the second charge generation layer 400, and the second light emitting unit 500. The second extension part 420 may horizontally extend from the second contact part 410 and may overlap the upper electrode 600 and the second sub pixel electrode 120 when viewed in the plane. At least a portion of the second extension part 420 may be disposed to overlap the pixel defining layer PDL.

In an embodiment of the inventive concept, the light emitting unit 500 may be disposed on the first and second charge generation layers 300 and 400 and may entirely cover the top surfaces of the first and second charge generation layers 300 and 400. The second light emitting unit 500 may emit, for example, second light having a second color.

In an embodiment of the inventive concept, a mixed color of the first and second colors may be, for example, a white color, and/or the first and second colors may complement each other. The first and second light may be mixed with each other to generate white light. The first and second colors may be, for example, a blue color and a yellow color, respectively. However, the embodiment of the inventive concept is not limited thereto. For example, the first and second colors may be a red color and a green color, respectively.

The upper electrode 600 may be disposed on the second light emitting unit 500. The upper electrode 600 may include a first upper electrode part 610 and a second upper electrode part 620. The first upper electrode part 610 may be connected (e.g., coupled) to the second contact part 410 through the second contact hole CNT2. The second upper electrode part 620 may extend from the first upper electrode part 610. The upper electrode 600 may be disposed on an entire top surface of the second light emitting unit 500. Thus, when viewed in the plane, the second upper electrode part 620 may overlap the first and second sub pixel electrodes 110 and 120.

In an embodiment of the inventive concept, the display panel DP may further include a color filter. In an embodiment of the inventive concept, the color filter may be disposed on (e.g., over) the upper electrode 600. The color filter may be, for example, formed on the upper electrode 600 in the form of a layer and then laminated or disposed on an upper substrate (not shown) facing the base substrate BS. Also, in an embodiment of the inventive concept, when the display panel DP is a bottom emission-type display panel (e.g., bottom emission display panel), the color filter may be disposed on a layer that is defined (e.g., positioned) between the first sub pixel electrode 110 and the base substrate BS.

In an embodiment of the inventive concept, the color filter may include first and second color filters CF1 and CF2. The first and second color filters CF1 and CF2 may transmit colors different from each other therethrough. The second color filter CF2 may be disposed in the second sub pixel area SPA2 to correspond to a second light emitting area EA2 defined on the second sub pixel electrode 120, and may be, for example, a green color filter. The first color filter CF1 may be disposed in the first sub pixel area SPA1 to correspond to a first light emitting area EA1 defined on the first sub pixel electrode 110, and may be, for example, a gray color filter. The gray color filter may block (or reduce) the transmission of a specific color therethrough and may reduce external light reflection by the first sub pixel electrode 110. The first color filter CF1 may be, for example, omitted.

Each of the first and second charge generation layers 300 and 400 has conductivity. In an embodiment of the inventive concept, the first and second charge generation layers 300 and 400 may include one or more inorganic materials selected from, for example, Ag, Mg, Yb, Al, Ca, Li, and Cs.

Each of the first and second sub pixel electrodes 110 and 120 and the upper electrode 600 may be formed of a conductive material. In some embodiments, each of the first and second sub pixel electrodes 110 and 120 and the upper electrode 600 may be a transparent electrode, a translucent electrode, an opaque electrode, or a reflective electrode. Also, each of the first and second sub pixel electrodes 110 and 120 and the upper electrode 600 may have a single-layered structure formed of a single material, a single-layered structure formed of a plurality of materials different from each other, or a multi-layered structure including a plurality of layers formed of a plurality of materials different from each other.

In an embodiment of the inventive concept, when each of the first and second sub pixel electrodes 110 and 120 and the upper electrode 600 is a transparent electrode or a translucent electrode, each of the first and second sub pixel electrodes 110 and 120 and the upper electrode 600 may include, for example, optical thin Li, Ca, LiF/Ca, LiF/Al, Al, Mg, BaF, Ba, Ag, or a combination or mixture thereof (e.g., a mixture of Ag and Mg) or may include transparent metal oxide, for example, indium tin oxide (ITO), indium zinc oxide (IZO), zinc oxide (ZnO), indium tin zinc oxide (ITZO), Mo, and/or Ti.

In an embodiment of the inventive concept, when each of the first and second sub pixel electrodes 110 and 120 and the upper electrode 600 is a reflective electrode, each of the first and second sub pixel electrodes 110 and 120 and the upper electrode 600 may include, for example, optical thick Ag, Mg, Al, Pt, Pd, Au, Ni, Nd, Ir, Cr, Li, Ca, LiF/Ca, LiF/Al, Mo, Ti, or a combination or mixture thereof (e.g., a mixture of Ag and Mg).

In an embodiment of the inventive concept, each of the first and second sub pixels SPX1 and SPX2 may be a bottom emission-type sub pixel or a top emission-type sub pixel (e.g., a bottom emission sub pixel or a top emission sub pixel). When each of the first and second sub pixels SPX1 and SPX2 is a bottom emission sub pixel, each of the first and second sub pixel electrodes may be a transparent or a translucent electrode, the upper electrode 600 may be a reflective electrode, and the light may be emitted to the outside through the first and second sub pixel electrodes 110 and 120. When each of the first and second sub pixels SPX1 and SPX2 is a top emission sub pixel, each of the first and second sub pixel electrodes 110 and 120 may be a reflective electrode, the upper electrode 600 may be a transparent or a translucent electrode, and the light may be emitted to the outside through the upper electrode 600.

In an embodiment of the inventive concept, each of the first and second sub pixels SPX1 and SPX2 may have a non-inverted structure or an inverted structure. When each of the first and second sub pixels SPX1 and SPX2 has the non-inverted structure, each of the first and second sub pixel electrodes 110 and 120 may be an anode, the upper electrode 600 may be a cathode, and a voltage applied to the first and second sub pixel electrodes 110 and 120 may be greater than that applied to the upper electrode 600. On the other hand, when each of the first and second sub pixels SPX1 and SPX2 has the inverted structure, each of the first and second sub pixel electrodes 110 and 120 may be a cathode, the upper electrode 600 may be an anode, and a voltage applied to the first and second sub pixel electrodes 110 and 120 may be less than that applied to the upper electrode 600.

Figure 4:
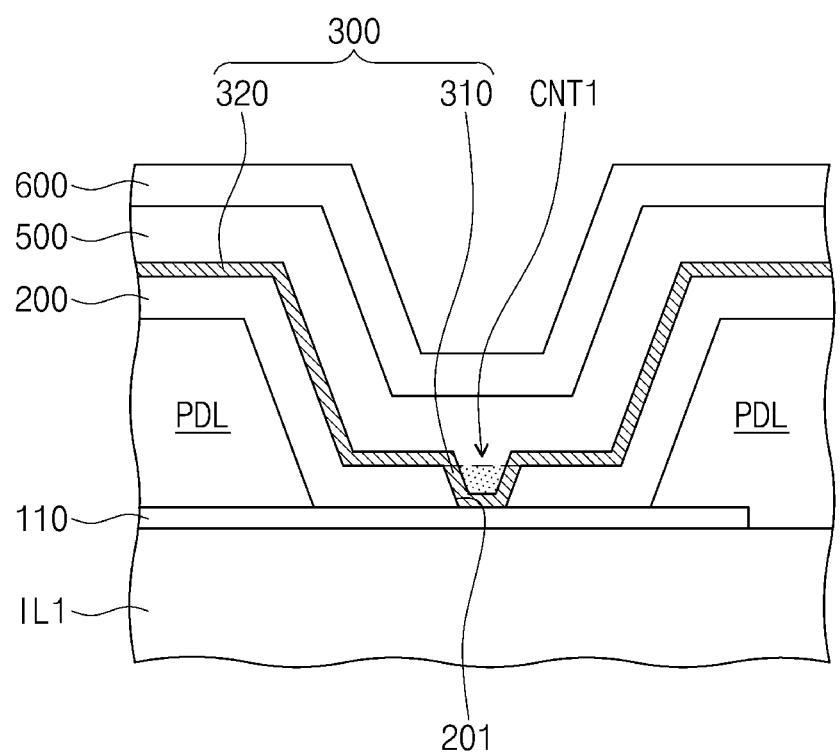
FIG. 4 is an enlarged cross-sectional view of a first contact hole of FIG. 3.

FIG. 4 is an enlarged cross-sectional view of the first contact hole of FIG. 3.

The first contact hole CNT1 may be defined in the first light emitting unit 200. The first contact hole CNT1 may be defined, for example, on the first sub pixel electrode 110. The first contact hole CNT1 may expose a portion of the first sub pixel electrode 110 and an inclined surface 201 of the first light emitting unit 200.

In this specification, the expression "the contact hole is defined in a layer" may refer to a space formed by removing a portion of the layer to form a contact hole. Thus, the first contact hole CNT1 may be defined as an empty space (a region with a dot pattern shading in FIG. 4) formed by removing a portion of the first light emitting unit 200.

In an embodiment, the first contact part 310 is disposed in the first contact hole CNT1. The first contact part 310 may refer to only the portion of the first charge generation layer 300 that is disposed in the first contact hole CNT1, (e.g., the portion of the first charge generation layer corresponding to a region that is surrounded by the inclined surface 201 of the first light emitting unit 200 and a top surface of the first sub pixel electrode 110).

The first contact part 310 may be connected to the first sub pixel electrode 110 that is exposed by the first contact hole CNT1. The first contact part 310 may, for example, directly contact the top surface of the first sub pixel electrode 110. The first contact part 310 may receive driving current and a first pixel voltage from the first sub pixel electrode 110.

The first extension part 320 may extend from the first contact part 310 and may be disposed on the first light emitting unit 200. The first extension part 320 may receive the driving current and the first pixel voltage from the first contact part 310.

Figure 5A:
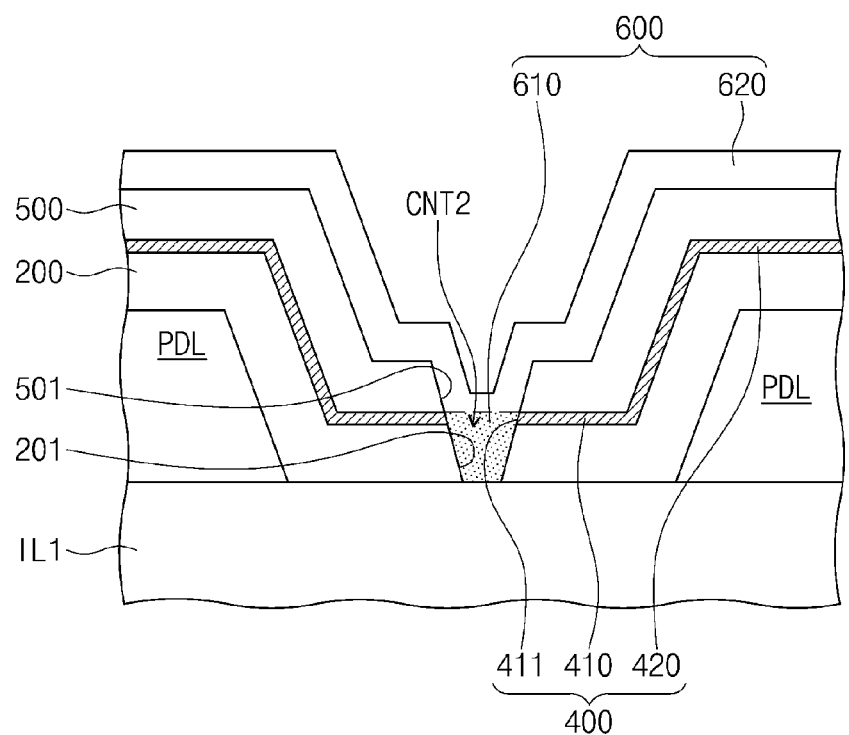
FIG. 5A is an enlarged cross-sectional view of a second contact hole of FIG. 3.
Figure 5B:
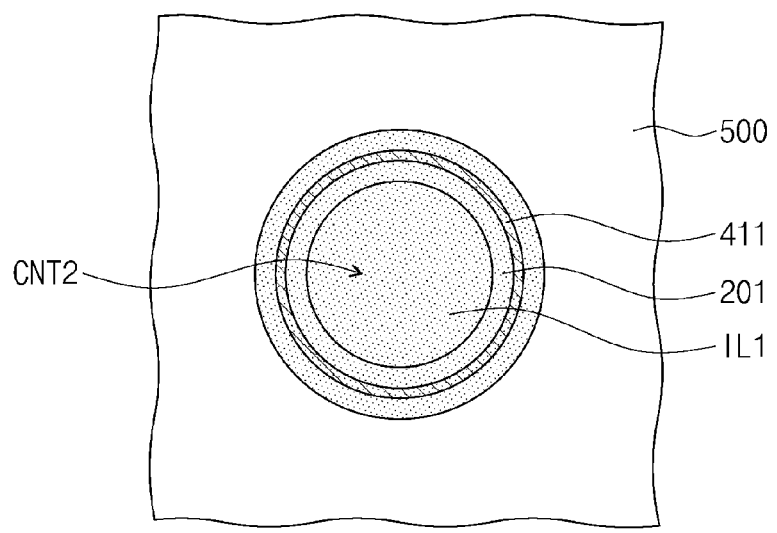
FIG. 5B is an enlarged plan view of the second contact hole of FIG. 3.

FIG. 5A is an enlarged cross-sectional view of the second contact hole of FIG. 3, and FIG. 5B is an enlarged plan view of the second contact hole of FIG. 3.

In FIGS. 5A and 5B, the second contact hole CNT2 may be designated by a dot pattern shading. It will be understood by those skilled in the art that the dot pattern shading may, but does not necessarily, indicate an empty space. In FIGS. 5A and 5B, for convenience of illustration of the second contact hole CNT2 and an inclined surface 411 of the second contact part 410, certain components may be omitted. For example, the upper electrode 600 may be omitted in FIG. 5B.

Referring to FIGS. 5A and 5B, the second contact hole CNT2 may be defined in the first light emitting unit 200, the second charge generation layer 400, and the second light emitting unit 500.

The second contact hole CNT2 may expose a portion of the first insulation layer IL1, the inclined surface 201 of the first light emitting unit 200, the inclined surface 411 of the second contact part 410, and an inclined surface 501 of the second light emitting unit 500.

In an embodiment of the inventive concept, the upper electrode 600 may include the first upper electrode part 610 and the second upper electrode part 620. The first upper electrode part 610 may be disposed in the second contact hole CNT2. The first upper electrode 610 may be connected (e.g., coupled) to the second contact part 410. The first upper electrode 610 may, for example, directly contact the inclined surface 411 of the second contact part 410. The second contact part 410 may transmit the driving current to the upper electrode 600.

Referring again to FIG. 3, the first pixel voltage may be applied to the first sub pixel electrode 110, and an upper voltage may be applied to the upper electrode 600. The first pixel voltage may be transmitted to the first extension part 320 disposed within the first light emitting area EA1 through the first contact part 310. As a result, a first electric field EF1 may be formed between the first extension part 320 and the upper electrode 600 to correspond to the first light emitting area EA1.

The first pixel voltage may be, for example, greater than the upper voltage. Thus, first driving current DC1 may flow along a first current path that is defined to be along the first sub pixel electrode 110, the first contact part 310, the first extension part 320, the second light emitting unit 500 of the first sub pixel SPX1, and the second upper electrode part 620 of the first sub pixel SPX1.

The second light emitting unit 500 of the first sub pixel SPX1 may generate second light L2 by the first driving current DC1 and the first electric field EF1. The second light L2 may pass through the first color filter CF1 and then be emitted upward (e.g., outward). When the first color filter CF1 is the gray color filter, the second color (e.g., blue color) of the second light L2 passing through the first color filter CF1 may not change.

As described above, when the first extension part 320 functions as the anode of the first sub pixel SPX1, the first electric field EF1 may be applied to only the second light emitting unit 500 of the first sub pixel SPX1. Since potential of the first extension part 320 is substantially the same as that of the first sub pixel electrode 110, an electric field may not be substantially generated in the first light emitting unit 200 of the first sub pixel SPX1. Thus, the driving voltage of the first sub pixel SPX1 may be reduced to improve efficiency of the first sub pixel SPX1.

Similarly, the second sub pixel may be improved in efficiency. For example, a second pixel voltage may be applied to the second sub pixel electrode 120, and the upper voltage may be applied to the upper electrode 600. The upper voltage may be transmitted to the second extension part 420 disposed within the second light emitting area EA2 through the second contact part 410. As a result, a second electric field EF2 may be formed between the second extension part 420 and the second sub pixel electrode 120 to correspond to the second light emitting area EA2.

The second pixel voltage may be, for example, greater than the upper voltage. Thus, second driving current DC2 may flow along a second current path that is defined to be along the second sub pixel electrode 120, the first light emitting unit 200, the second extension part 420, the second contact part 410, and the first upper electrode part 610.

The first light emitting unit 200 of the second sub pixel SPX2 may generate the first light L1 by the second driving current DC2 and the second electric field EF2. The first light L1 may pass through the second color filter CF2 and then be emitted upward (e.g., outward). In an embodiment of the inventive concept, when the second color filter CF2 is the green color filer, the first color (e.g., yellow color) of the first light L1 passing through the second color filter CF2 may change into a green color.

As described above, when the second extension part 420 functions as the cathode of the second sub pixel SPX2, the second electric field EF2 may be applied to only the first light emitting unit 200 of the second sub pixel SPX2. Since potential of the upper electrode 600 is substantially the same as that of the second extension part 420, an electric field may not be substantially generated in the second light emitting unit 500 of the second sub pixel SPX2. Thus, the driving voltage of the second sub pixel SPX2 may be reduced to improve efficiency of the second sub pixel SPX2.

Figure 6:
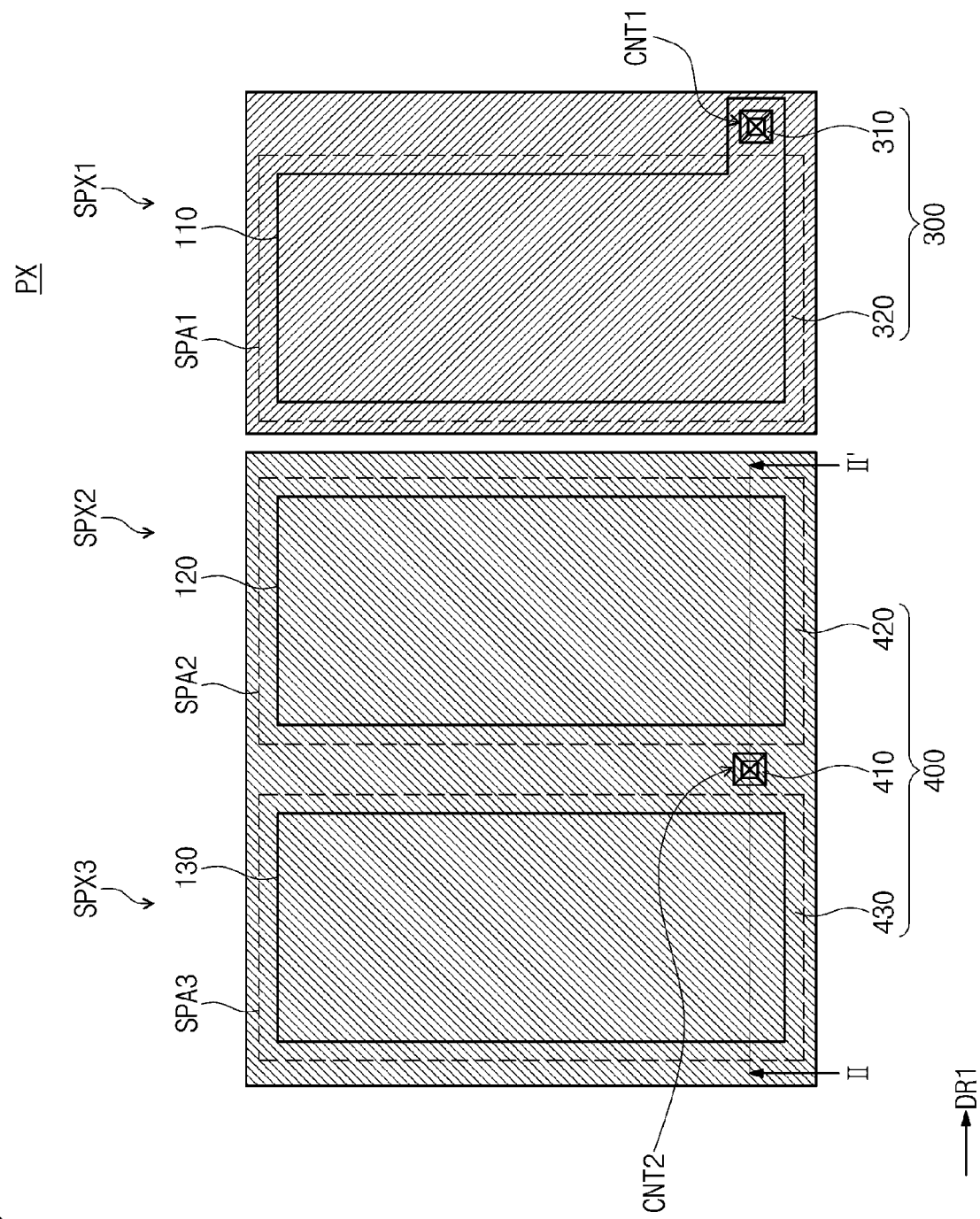
FIG. 6 is a schematic plan view of pixels according to an embodiment of the inventive concept.
Figure 7:
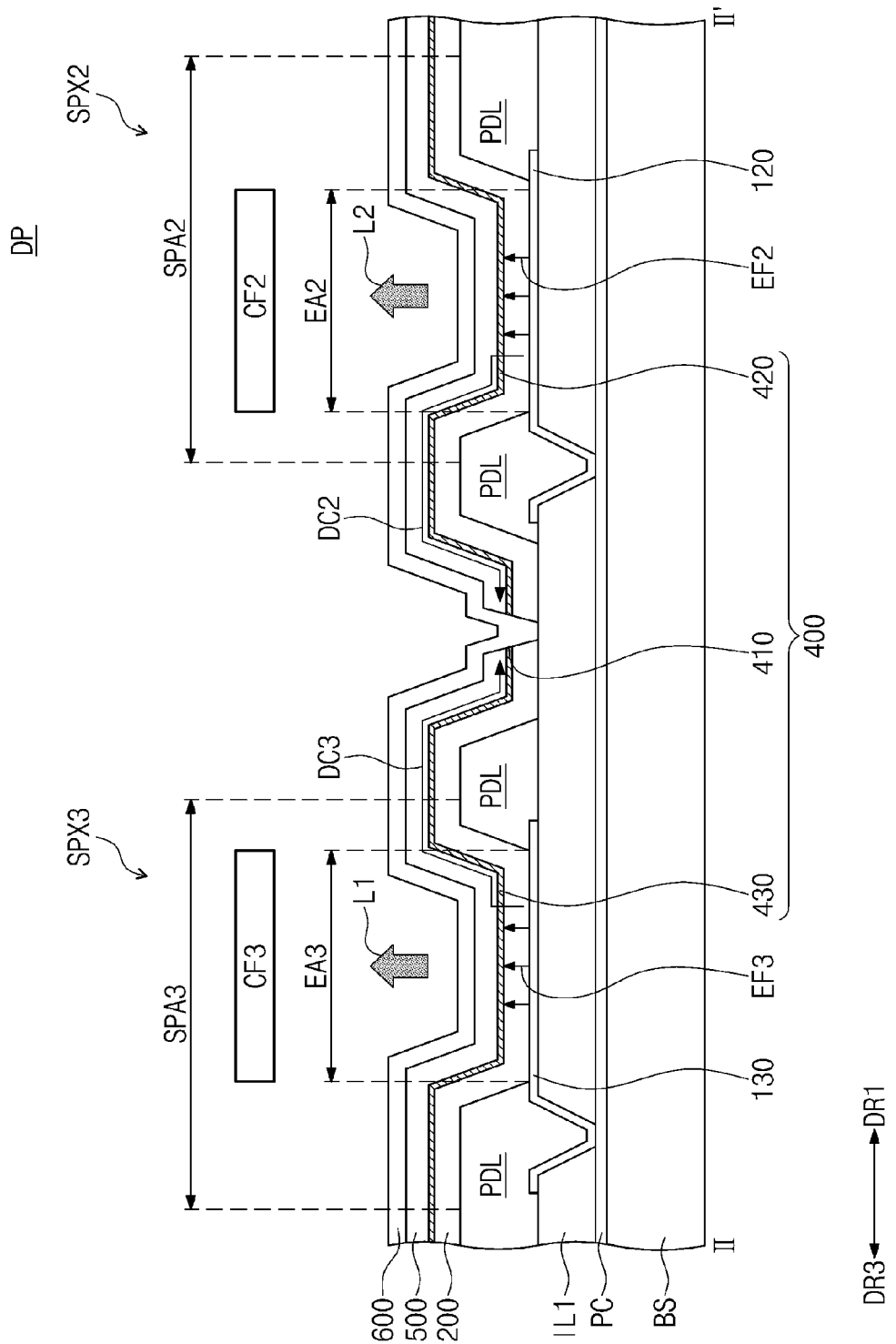
FIG. 7 is a cross-sectional view taken along line II-II' of FIG. 6.

FIG. 6 is a schematic plan view of a pixel according to an embodiment of the inventive concept, and FIG. 7 is a cross-sectional view taken along line II-II' of FIG. 6.

Since a pixel PX of FIG. 6 is similar to the pixel PX of FIG. 3, the following description will mainly focus on the differences with respect to an additional third sub pixel SPX3, and duplicative descriptions of the elements same as those described above in connection with FIG. 3 will not be provided.

Referring to FIG. 6, the pixel PX according to an embodiment of the inventive concept may further include the third sub pixel SPX3. The third sub pixel SPX3 may be an example of the sub pixels SPX illustrated in FIG. 1.

In an embodiment of the inventive concept, the third sub pixel SPX3 may be a sub pixel having a color different from those of the first and second sub pixels SPX1 and SPX2. The third sub pixel SPX3 may be, for example, a red sub pixel. The first to third sub pixels SPX1 to SPX3 may be successively arranged with each other along the first direction DR1. The second contact hole CNT2 may be disposed, for example, between the second and third sub pixels SPX2 and SPX3 when viewed in the plane.

Referring to FIG. 7, the display panel DP may further include a third sub pixel electrode 130. The third sub pixel electrode 130 may be disposed on the first insulation layer IL1. The third sub pixel electrode 130 may be spaced apart from the first and second sub pixel electrodes 110 and 120 when viewed in the plane. A portion of the third sub pixel electrode 130 may be disposed in the contact hole defined in the first insulation layer IL1 to directly contact the pixel circuit layer PC and independently receive the driving current from the pixel circuit layer PC.

In an embodiment of the inventive concept, a portion of the first light emitting unit 200 may extend and be disposed on the third sub pixel electrode 130.

In an embodiment of the inventive concept, the second charge generation layer 400 may further include a third extension part 430. The third extension part 430 may extend from the second contact part 410 to overlap the third sub pixel electrode 130 when viewed in the plane. The third extension part 430 may, for example, extend from the second contact part 410 in a third direction DR3 that is opposite to the first direction DR1.

The third extension part 430 may be disposed on the first light emitting unit 200 to correspond to a third sub pixel area SPA3. The third extension part 430 may be disposed between first and second light emitting units 200 and 500 of the third sub pixel SPX3 to supply charges (e.g., electrons and/or holes) to the first and second light emitting units 200 and 500 of the third sub pixel SPX3, and may adjust a balance of the supplied charges.

In an embodiment of the inventive concept, a portion of the second light emitting unit 500 may extend and be disposed on the third extension part 430 and may cover an entire top surface of the third extension part 430.

The second extension part 620 may extend from the first contact part 610 to overlap the third sub pixel electrode 130 when viewed in the plane.

The color filter may further include a third color filter CF3. The third color filter CF3 may transmit a color different from that transmitted through the second color filter CF2. The third color filter CF3 may be disposed in the third sub pixel area SPA3 to correspond to a third light emitting area EA3 defined on the third sub pixel electrode 130 and may be, for example, a red color filter.

According to an embodiment of the inventive concept, the third sub pixel SPX3 may be improved in efficiency. For example, a third pixel voltage may be applied to the third sub pixel electrode 130, and the upper voltage may be applied to the upper electrode 600. The upper voltage may be transmitted to the third extension part 430 disposed within the third light emitting area EA3 through the second contact part 410. As a result, a third electric field EF3 may be formed between the third extension part 430 and the third sub pixel electrode 130 to correspond to the third light emitting area EA3.

The third pixel voltage may be, for example, greater than the upper voltage. Thus, third driving current DC3 may flow along a third current path that is defined to be along the third sub pixel electrode 130, the first light emitting unit 200, the third extension part 430, the second contact part 410, and the first upper electrode part 610.

The first light emitting unit 200 of third second sub pixel SPX3 may generate the first light L1 by the third driving current DC3 and the third electric field EF3. The first light L1 may pass through the third color filter CF3 and then be emitted upward (e.g., outward). In an embodiment of the inventive concept, when the third color filter CF3 is the red color filer, the first color (e.g., yellow color) of the first light L1 passing through the third color filter CF3 may change into a red color.

As described above, when the third extension part 430 functions as the cathode of the third sub pixel SPX3, the third electric field EF3 may be applied to only the first light emitting unit 200 of the third sub pixel SPX3. Since potential of the upper electrode 600 is substantially the same as that of the third extension part 430, an electric field may not be substantially generated in the second light emitting unit 500 of the third sub pixel SPX3. Thus, the driving voltage of the third sub pixel SPX3 may be reduced to improve efficiency of the third sub pixel SPX3.

Figure 8:
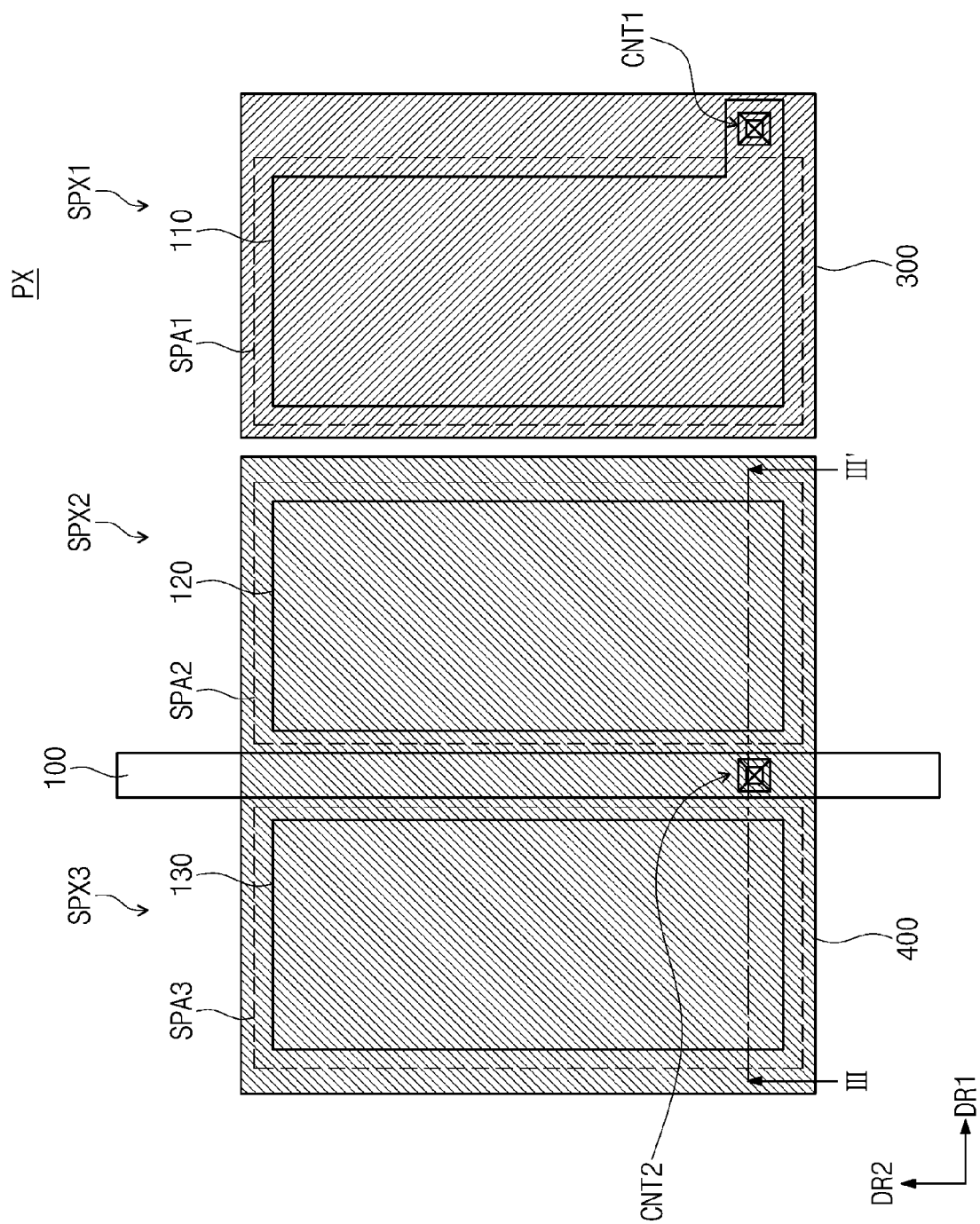
FIG. 8 is a schematic plan view of pixels according to an embodiment of the inventive concept.
Figure 9:
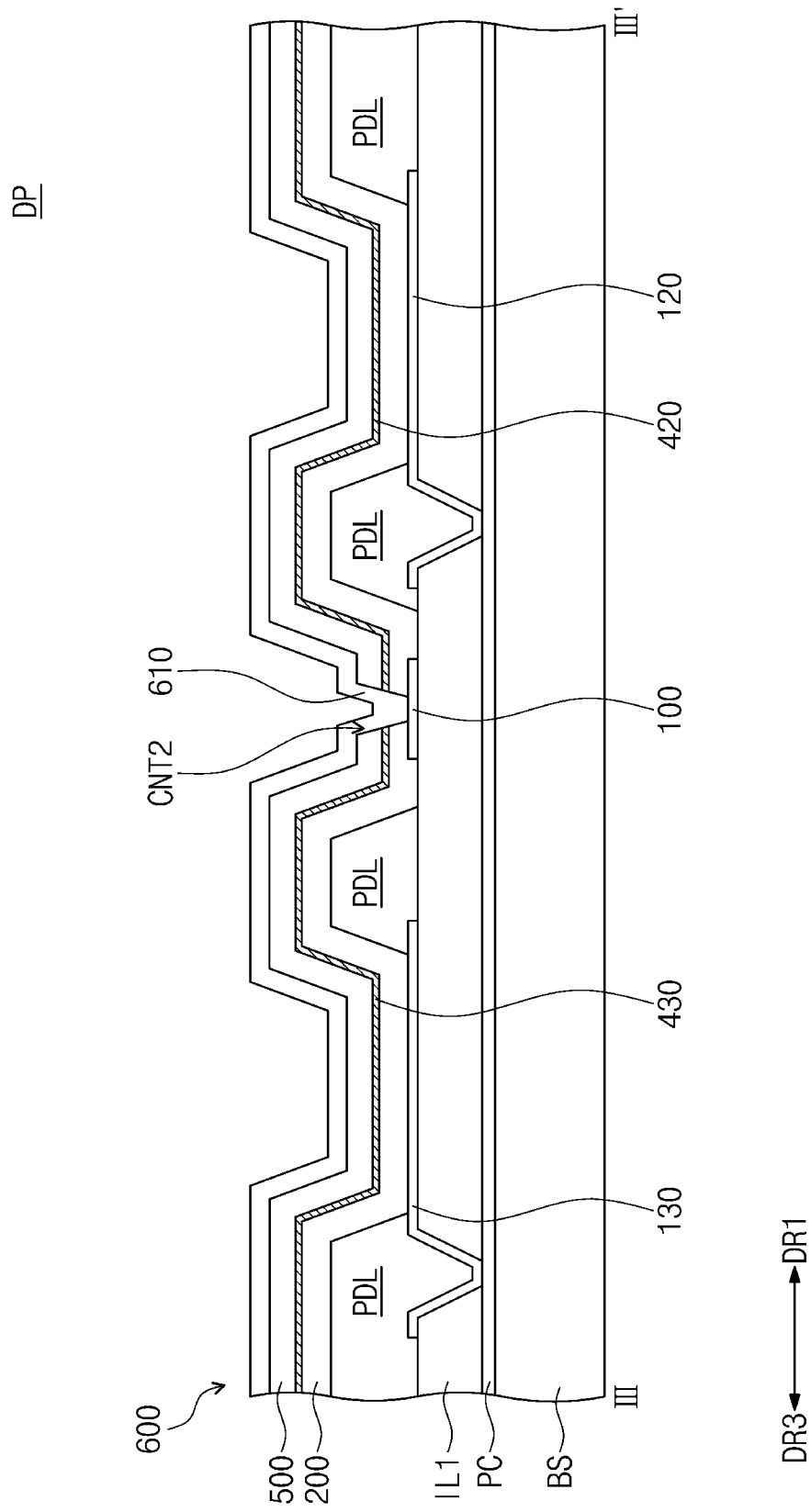
FIG. 9 is a cross-sectional view taken along line III-III' of FIG. 8.

FIG. 8 is a schematic plan view of a pixel according to an embodiment of the inventive concept, and FIG. 9 is a cross-sectional view taken along line III-III' of FIG. 8.

Since a pixel PX of FIG. 8 is similar to the pixel PX of FIG. 6, the following description will mainly focus on the differences with respect to an additional auxiliary line 100, and duplicative descriptions of the elements same as those described above in connection with FIG. 6 will not be provided.

Referring to FIGS. 8 and 9, the display panel DP according to an embodiment of the inventive concept further includes the auxiliary line 100.

In an embodiment of the inventive concept, when viewed in the plane, the auxiliary line 100 may be disposed between the second and third sub pixels SPX2 and SPX3 to extend in the second direction DR2. Although not shown, a plurality of the auxiliary lines 100 may be provided. The plurality of auxiliary lines may be arranged with each other along the first direction DR1 to either correspond to each pixel or correspond to every two or more of the pixels PX.

In an embodiment of the inventive concept, the auxiliary line 100 may be disposed between the first insulation layer IL1 and the first light emitting unit 200. The second contact hole CNT2 may expose, for example, a top surface of the auxiliary line 100. Thus, the first upper electrode part 610 may be connected (e.g., coupled) to the auxiliary line 100. The first upper electrode part 610 may, for example, directly contact the exposed top surface of the auxiliary line 100.

The auxiliary line 100 may prevent or reduce an IR-drop from occurring in the display panel DP. For example, when the upper electrode 600 is disposed on (e.g., over) an entire top surface of the base substrate BS, the IR-drop may occur in the upper electrode 600 in the horizontal direction, and brightness of the pixel PX may change according to a position of the display panel DP. To prevent or reduce the IR-drop from occurring, the upper electrode 600 may be connected to the auxiliary line 100. Since the auxiliary line 100 is connected (e.g., coupled) to the upper electrode 600, the total resistance may be reduced to prevent or reduce the occurrence of the IR-drop in the upper electrode 600. As a result, as the occurrence of the IR-drop is reduced, the driving voltages of the second and third sub pixels SPX2 and SPX3 may be improved to improve efficiency of the second and third sub pixels SPX2 and SPX3.

Figure 10:
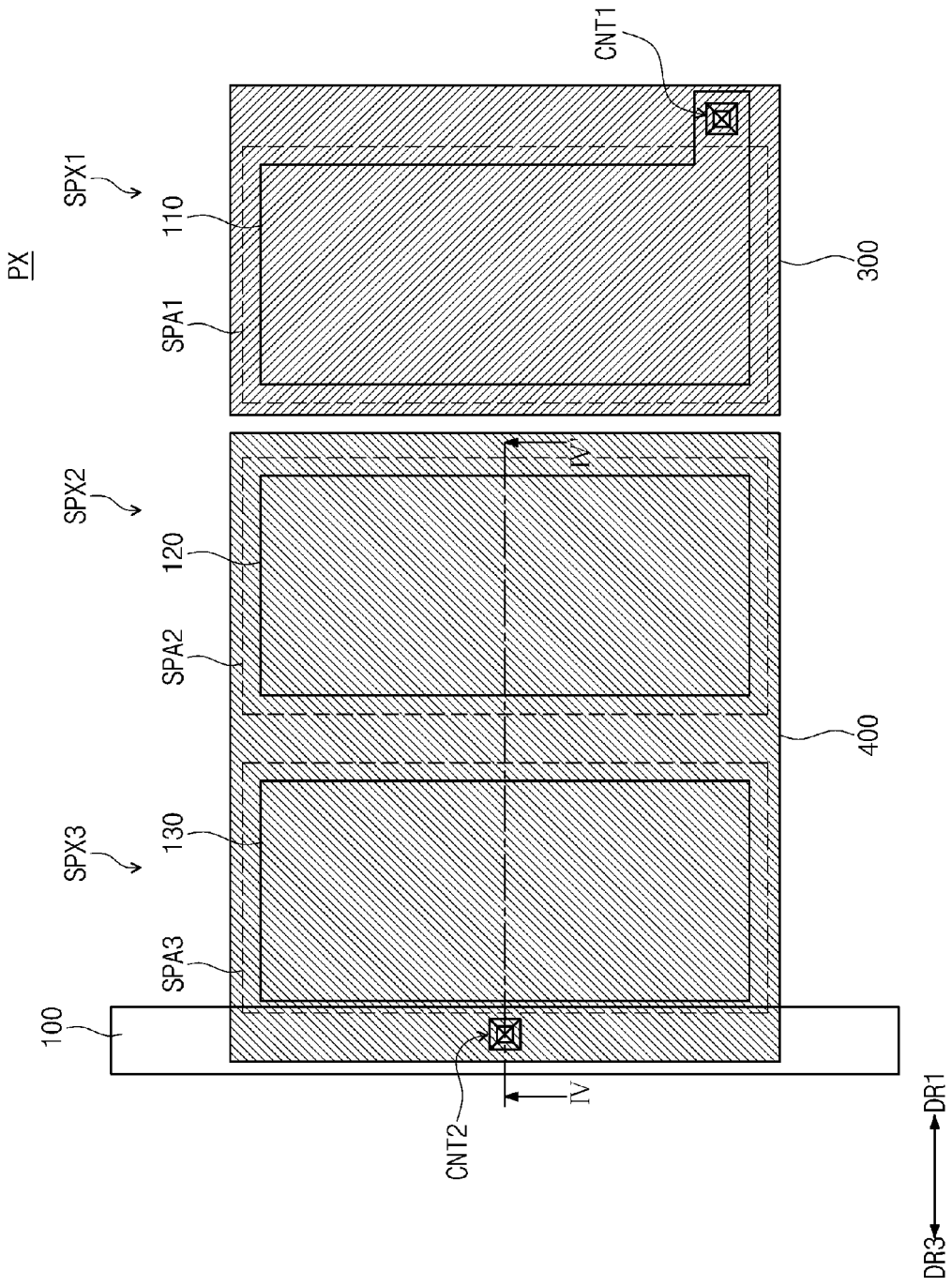
FIG. 10 is a schematic plan view of pixels according to an embodiment of the inventive concept.
Figure 11:
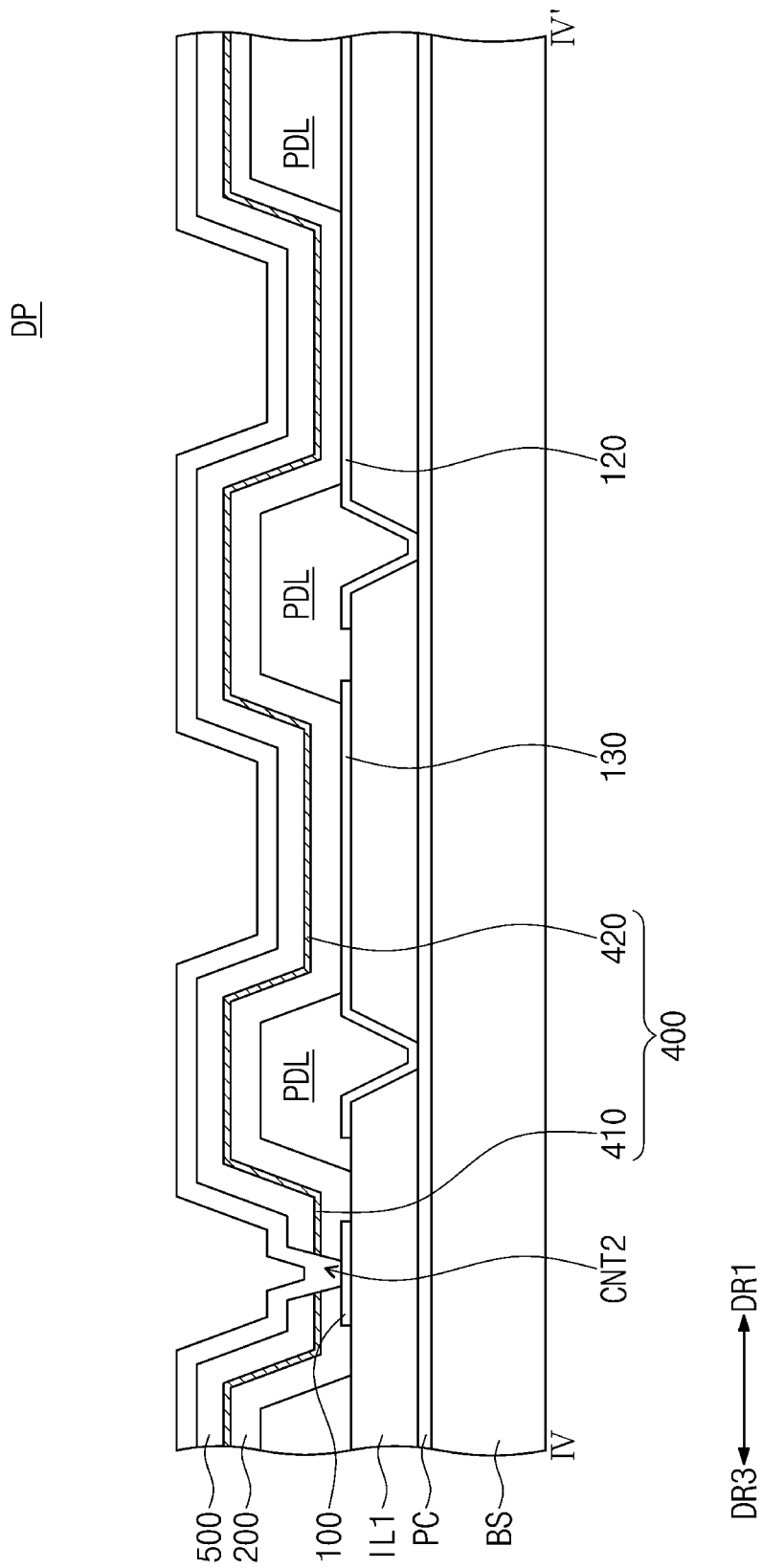
FIG. 11 is a cross-sectional view taken along line IV-IV' of FIG. 10.

FIG. 10 is a schematic plan view of a pixel according to an embodiment of the inventive concept, and FIG. 11 is a cross-sectional view taken along line IV-IV' of FIG. 10.

Since a pixel PX of FIG. 10 is similar to the pixel PX of FIG. 6, the following description will mainly focus on the differences with respect to the second contact hole CNT2, and duplicative descriptions of the elements same as those described above in connection with FIG. 6 will not be provided.

Referring to FIGS. 10 and 11, in an embodiment of the inventive concept, the second contact hole CNT2 and the auxiliary line 100 may be spaced apart from the third sub pixel electrode 130 in the third direction DR3.

Since in the present embodiment, the second contact hole CNT2 is not disposed between the second and third sub pixels SPX2 and SPX3, a distance between the second and third sub pixels SPX2 and SPX3 may be reduced. Also, the auxiliary line 100 may be widened in line width, and thus the auxiliary line 100 may be effectively (or suitably) reduced in resistance, and the IR drop of the upper electrode 600 may be prevented or substantially reduced.

Figure 12:
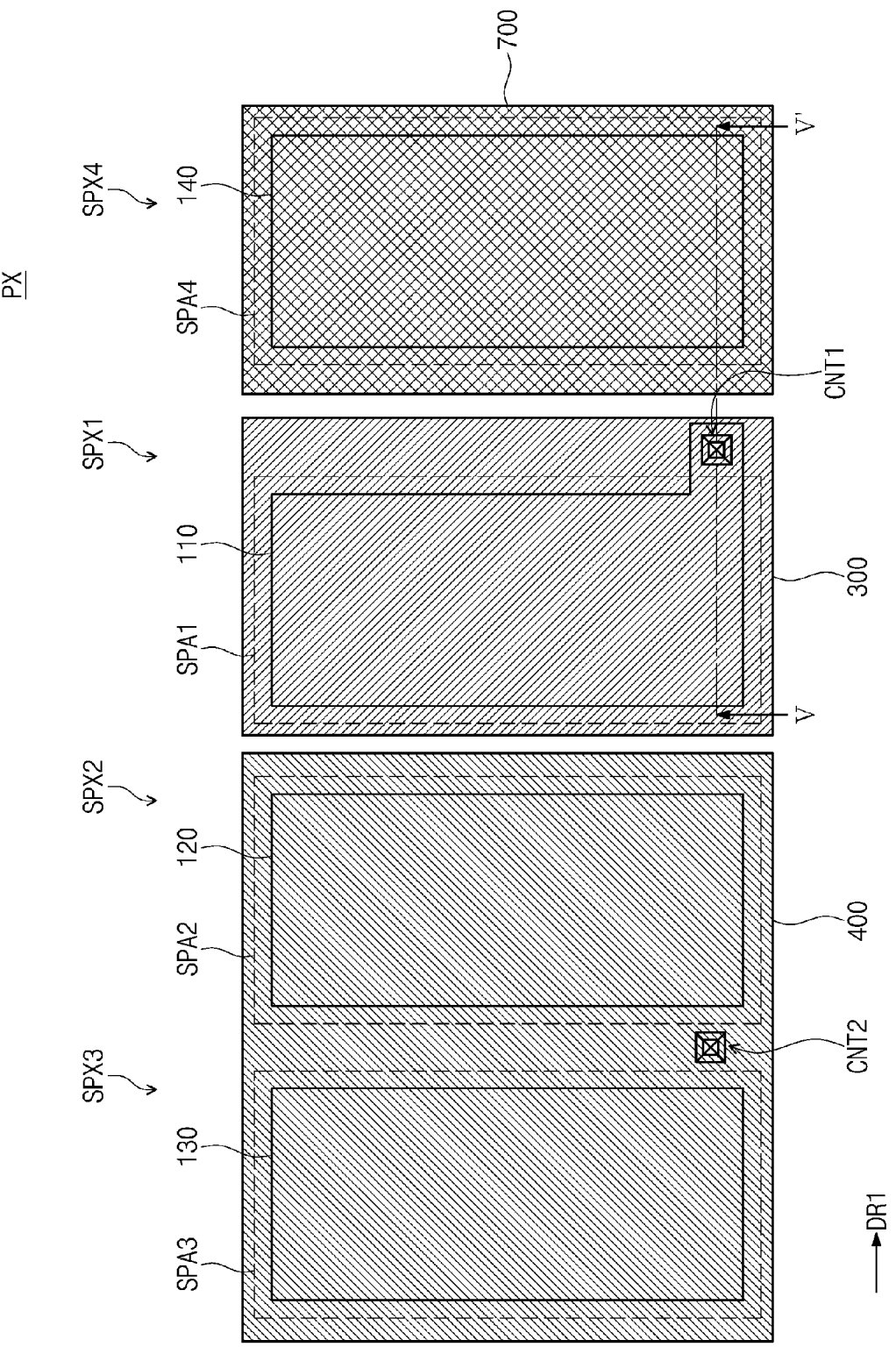
FIG. 12 is a schematic plan view of pixels according to an embodiment of the inventive concept.
Figure 13:
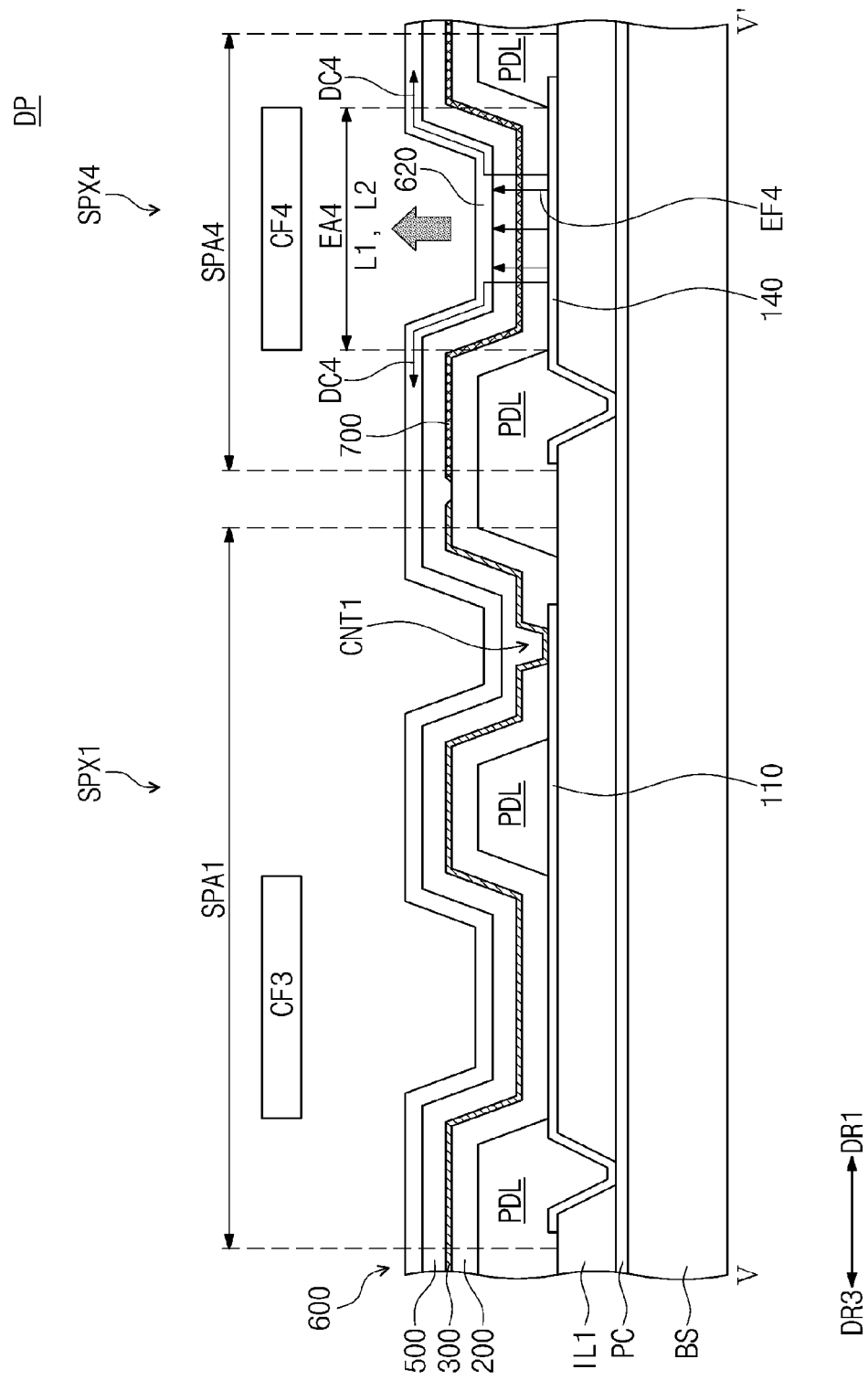
FIG. 13 is a cross-sectional view taken along line V-V' of FIG. 12.

FIG. 12 is a schematic plan view of the pixel according to an embodiment of the inventive concept, and FIG. 13 is a cross-sectional view taken along line V-V' of FIG. 12.

Since a pixel PX of FIG. 12 is similar to the pixel PX of FIG. 6, the following description will mainly focus on the differences with respect to an additional fourth sub pixel SPX4, and duplicative descriptions of the elements same as those described above in connection with FIG. 6 will not be provided.

Referring to FIG. 12, the pixel PX according to an embodiment of the inventive concept may further include the fourth sub pixel SPX4. The fourth sub pixel SPX4 may be an example of the sub pixels SPX illustrated in FIG. 1.

In an embodiment of the inventive concept, the fourth sub pixel SPX4 may be a sub pixel having a color different from those of the first to third sub pixels SPX1 to SPX3. The fourth sub pixel SPX4 may be, for example, a white sub pixel. The first to fourth sub pixels SPX1 to SPX4 may be successively arranged in the first direction DR1. The first contact hole CNT1 may be disposed, for example, between the first and fourth sub pixels SPX1 and SPX4 when viewed in the plane.

Referring to FIG. 13, the display panel DP may further include a fourth sub pixel electrode 140. The fourth sub pixel electrode 140 may be disposed on the first insulation layer IL1. The fourth sub pixel electrode 140 may be spaced apart from the first sub pixel electrode 110 in first direction DR1 when viewed in the plane. A portion of the fourth sub pixel electrode 140 may be disposed in the contact hole defined in the first insulation layer IL1 to directly contact the pixel circuit layer PC and independently receive the driving current from the pixel circuit layer PC.

In an embodiment of the inventive concept, a portion of the first light emitting unit 200 may extend and be disposed on the fourth sub pixel electrode 140.

In an embodiment of the inventive concept, the display panel DP may further include a third charge generation layer 700. The third charge generation layer 700 may not overlap the first and second charge generation layers 300 and 400 when viewed in the plane and may be insulated from the first and second charge generation layers 300 and 400.

The third charge generation layer 700 may be disposed on the first light emitting unit 200 to correspond to a fourth sub pixel area SPA4. The third charge generation layer 700 may be disposed between first and second light emitting units 200 and 500 of the fourth sub pixel SPX4 to supply charges (e.g., electrons and/or holes) to the first and second light emitting units 200 and 500 of the fourth sub pixel SPX4 and to adjust a balance of the supplied charges.

In an embodiment of the inventive concept, a portion of the second light emitting unit 500 may extend and be disposed on the third charge generation layer 700 and may cover an entire top surface of the third charge generation layer 700.

A portion of the second upper electrode part 620 may overlap the fourth sub pixel electrode 140 when viewed in the plane.

The color filter may further include a fourth color filter CF4. The fourth color filter CF4 may be disposed in the fourth sub pixel area SPA4 to correspond to a fourth light emitting area EA4 defined on the fourth sub pixel electrode 140 and may be, for example, a gray color filter. In some embodiments, the fourth color filter CF4 may not be provided.

A fourth pixel voltage may be applied to the fourth sub pixel electrode 140, and the upper voltage may be applied to the second upper electrode part 620 of the upper electrode 600. As a result, a fourth electric field EF4 may be formed between the fourth sub pixel electrode 140 and the second upper electrode part 620 to correspond to the fourth light emitting area EA4.

The fourth pixel voltage may be, for example, greater than the upper voltage. Thus, fourth driving current DC4 may flow along a fourth current path that is defined to be along the fourth sub pixel electrode 140, the first light emitting unit 200, the third charge generation layer 700, and the second upper electrode part 620.

Both the first and the second light emitting units 200 and 500 of the fourth sub pixel SPX4 may emit light to generate the first and second lights L1 and L2 by the fourth driving current DC4 and the fourth electric field EF4. The first and second lights L1 and L2 may be mixed with each other to generate white light. The white light may pass through the fourth color filter CF4 and then be emitted upward (e.g., outward). When the fourth color filter CF4 is the gray color filter, the color (e.g., white color) of the white light passing through the fourth color filter CF4 may not change.

Figure 14:
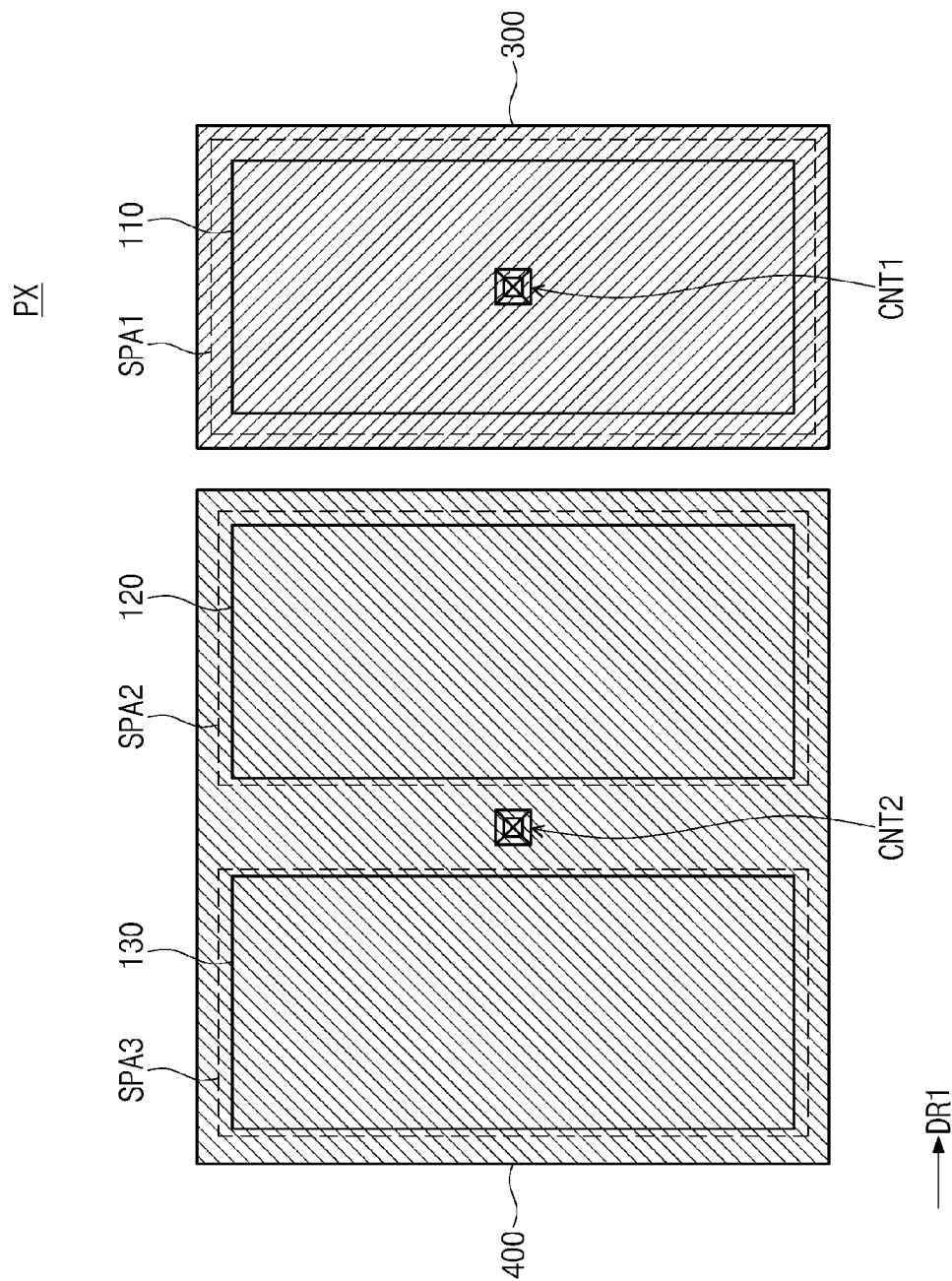
FIG. 14 is a schematic plan view of pixels according to an embodiment of the inventive concept.

FIG. 14 is a schematic plan view of a pixel according to an embodiment of the inventive concept.

Since a pixel PX of FIG. 14 is similar to the pixel PX of FIG. 6, the following description will mainly focus on the differences with respect to the modified first and second contact holes CNT1 and CNT2, and duplicative descriptions of the elements same as those described above in connection with FIG. 6 will not be provided.

Referring to FIG. 14, in an embodiment of the inventive concept, the first contact hole CNT1 may be defined (e.g., positioned) in a central portion of the first sub pixel area SPA1. Here, a central portion of the first charge generation layer 300 may be connected (e.g., coupled) to the first sub pixel electrode 110 through the first contact hole CNT1. Thus, a first pixel voltage may be uniformly (or substantially uniformly) distributed in the first charge generation layer 300.

In an embodiment of the inventive concept, the second contact hole CNT2 may be defined in a center of the second charge generation layer 400. Here, a central portion of the second charge generation layer 400 may be connected (e.g., coupled) to the upper electrode (see e.g., reference numeral 600 of FIG. 3) through the second contact hole CNT2. Thus, the upper voltage may be uniformly (or substantially uniformly) distributed in the second charge generation layer 400.

Figure 15:
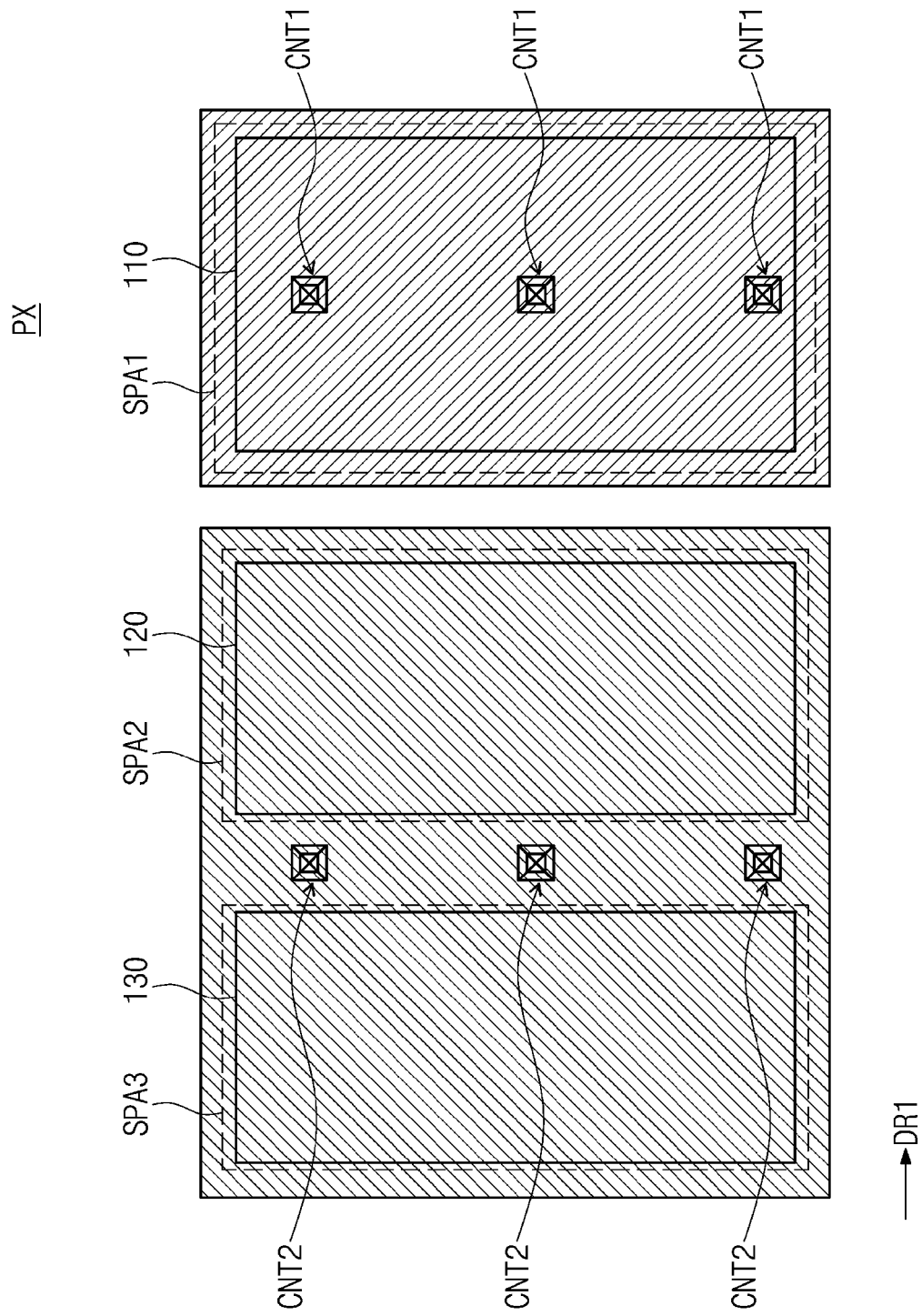
FIG. 15 is a schematic plan view of pixels according to an embodiment of the inventive concept.

FIG. 15 is a schematic plan view of a pixel according to an embodiment of the inventive concept.

Since a pixel PX of FIG. 15 is similar to the pixel PX of FIG. 6, the following description will mainly focus on the differences with respect to the modified first and second contact holes CNT1 and CNT2, and duplicative descriptions of the elements same as those described above in connection with FIG. 6 will not be provided. Referring to FIG. 15, each of the first and second contact holes CNT1 and CNT2 may be provided in plurality.

The plurality of the first and second contact holes CNT1 and CNT2 may each independently be arranged with each other, for example, along the second direction DR2. However, the embodiment of the inventive concept is not limited thereto. For example, the first and second contact holes CNT1 and CNT2 may each independently be arranged in the form of a matrix in the first and second directions DR1 and DR2.

When each of the first and second contact holes CNT1 and CNT2 is provided in plurality, the distribution of the first pixel voltage in the first charge generation layer 300 and the distribution of the upper voltage in the second charge generation layer 400 may be uniform (or substantially uniform).

Figure 16:
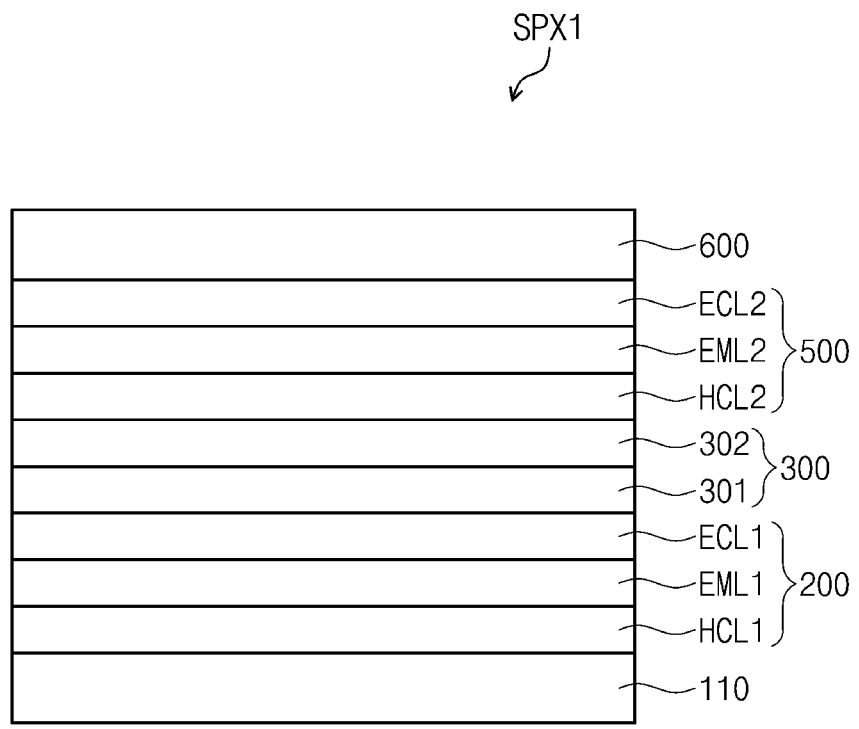
FIG. 16 is a schematic cross-sectional view of a first sub pixel according to an embodiment of the inventive concept.

FIG. 16 is a schematic cross-sectional view of the first sub pixel according to an embodiment of the inventive concept.

Referring to FIG. 16, the first light emitting unit 200 may include a first hole control layer HCL1, a first light emitting layer EML1, and a first electron control layer ECL1. The second light emitting unit 500 may include a second hole control layer HCL2, a second light emitting layer EML2, and a second electron control layer ECL2.

The first and second light emitting layers EML1 and EML2 may be disposed between the first sub pixel electrode 110 and the upper electrode 600. In an embodiment of the inventive concept, each of the first and second light emitting layers EML1 and EML2 may include a host material and a dopant material. For example, each of the first and second light emitting layers EML1 and EML2 may be formed by doping a phosphorescent or fluorescent material into the host material.

The host material is not specifically limited so long as the host material is a suitable material capable of being used in an organic light emitting device. For example, the host material may include tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4"-Tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), and/or 2-methyl-9,10-bis(naphthalen-2-yl)anthracene (MADN).

A color of light emitted from a corresponding light emitting layer may be determined by the combination of the host material and the dopant material. For example, when the corresponding light emitting layer emits light having a red color, the corresponding light emitting layer may include a phosphorescent material including tris(dibenzoylmeth-anato)phenanthoroline europium (PBD:Eu(DBM)3(Phen)) and/or perylene.

The dopant material included in the corresponding light emitting layer may be, for example, a metal complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and/or octa-ethylporphyrin platinum (PtOEP), and/or an organometallic complex.

For example, when the corresponding light emitting layer emits light having a green color, the corresponding light emitting layer may include a fluorescent material including tris(8-hydroxyquinolino)aluminum (Alq3). Here, the dopant material included in the corresponding light emitting layer may be, for example, a metal complex such as fac-tris(2-phenylpyridine)iridium (Ir(ppy)3), and/or an organometallic complex.

For example, when the corresponding light emitting layer emits light having a blue color, the corresponding light emitting layer may include a fluorescent material including at least one selected from spiro-DPVBi, spiro-6P, distyryl-benzene (DSB), distyryl-arylene (DSA), polyfluorene (PFO)-based polymer and poly(p-phenylene vinylene (PPV)-based polymer. Here, the dopant material included in the corresponding light emitting layer may be, for example, a metal complex such as (4,6-F2ppy)2Irpic, and/or an organometallic complex.

The first light emitting layer EML1 may generate light having a relatively short wavelength when compared to that of the second light emitting layer EML2. As described above, the first light may be blue light and have a wavelength ranging from about 450 nm to about 595 nm.

As described above, the second light may be yellow light and have a wavelength ranging from about 570 nm to about 590 nm.

However, the above-described description is merely an example embodiment, and the present inventive concept is not limited thereto. The first and second light emitting layers EML1 and EML2 according to an embodiment of the inventive concept may be designed to generate light having various colors and also may not be limited to any one embodiment.

Each of the first and second light emitting layers EML1 and EML2 may be formed by using various methods such as a vacuum deposition method, a spin coating method, a casting method, a Langmuir-Blodgett (LB) method, an inject printing method, a laser printing method, and/or a laser induced thermal imaging (LITI) method.

The first charge generation layer 300 may be disposed between the first and second light emitting layers EML1 and EML2 to improve current efficiency and optical efficiency of the first sub pixel SPX1. When a voltage is applied to the first charge generation layer 300, a complex may be formed by oxidation-reduction reaction to generate charges.

In an embodiment of the inventive concept, the first charge generation layer 300 may include lower and upper charge generation layers 301 and 302, which may be successively laminated. The lower and upper charge generation layers 301 and 302 may be, for example, an N-type charge generation layer and a P-type charge generation layer, respectively. The N-type charge generation layer may be an organic layer that is doped with an alkali metal such as Li, Na, K, and/or Cs, and/or an alkali earth metal such as Mg, Sr, Ba, and/or Ra. However, the embodiment of the inventive concept is not limited thereto. The P-type charge generation layer may be an organic layer including a P-type dopant. However, the embodiment of the inventive concept is not limited thereto.

The first hole control layer HCL1 may be disposed between the first sub pixel electrode 110 and the first light emitting layer EML1. The second hole control layer HCL2 may be disposed between the first charge generation layer 300 and the second light emitting layer EML2.

When the first sub pixel electrode 110 is an anode electrode layer, holes injected from the first sub pixel electrode 110 may reach the first light emitting layer EML1 via the first hole control layer HCL1. The holes generated in the first charge generation layer 300 may reach the second light emitting layer EML2 via the second hole control layer HCL2.

Each of the first and second hole control layers HCL1 and HCL2 may be divided into at least one region selected from a hole injection region, a hole transporting region, a buffer region, and an electron blocking region. Each of the first and second hole control layers HCL1 and HCL2 may have a single-layered structure formed of a single material, a single-layered structure formed of a plurality of materials different from each other, or a multi-layered structure including a plurality of layers formed of a plurality of materials different from each other.

For example, each of the first and second hole control layers HCL1 and HCL2 may include at least one selected from a hole injection layer corresponding to a hole injection region and a hole transporting layer corresponding to a hole transporting region, or may be a single layer having a hole injection function and a hole transporting function at the same time (e.g., by mixing a hole injection material and a hole transporting material in a single layer).

Each of the first and second hole control layers HCL1 and HCL2 may be formed of at least one selected from a hole injection material and a hole transporting material. The hole injection material and the hole transporting material may each independently be any suitable material.

The hole transporting material may include, for example, a carbazole-based derivative such as N-phenylcarbazole and/or polyvinylcarbazole, a fluorine-based derivative, a triphenylamine-based derivative such as N,N'-bis(3-methylphenyl)-N,N'-diphenyl-[1,1-biphenyl]-4,4'-diamine (TPD) and/or 4,4',4"-tris(N-carbazolyl)triphenylamine (TCTA), N,N'-di(1-naphthyl)-N,N'-diphenylbenzidine (NPB), and/or 4,4'-Cyclohexylidene bis[N,N-bis(4-methylphenyl)benzenamine] (TAPC), but is not limited thereto. The hole injection material may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N-(2-naphthyl)-N-phenylamino}-triphenylamine (2TNATA), poly(3,4-ethylenedioxythiophene)/poly(4-styrenesulfonate (PEDOT/PSS), polyaniline/dodecylbenzenesulfonic acid (PANI/DBSA), polyaniline/camphor sulfonic acid (PANI/CSA), and/or polyaniline/poly(4-styrenesulfonate) (PANI/PSS), but is not limited thereto.

Each of the first and second hole control layers HCL1 and HCL2 may be formed through a process similar to that for forming the first and second light emitting layers EML1 and EML2. For example, each of the first and second hole control layers HCL1 and HCL2 may be formed by using various methods such as a vacuum deposition method, a spin coating method, a casting method, a Langmuir-Blodgett (LB) method, an inject printing method, a laser printing method, and/or a laser induced thermal imaging (LITI) method.

Each of the first and second hole control layers HCL1 and HCL2 may include a hole blocking layer corresponding to the hole blocking region. Here, each of the first and second hole control layers HCL1 and HCL2 may include any suitable hole blocking material. Also, each of the first and second hole control layers HCL1 and HCL2 may further include a charge generation material.

The first electron control layer ECL1 may be disposed between the first light emitting layer EML1 and the first charge generation layer 300. The electrons generated in the first charge generation layer 300 may reach the first light emitting layer EML1 via the first electron control layer ECL1.

The second electron control layer ECL2 may be disposed between the second light emitting layer EML2 and the upper electrode 600. When the upper electrode 600 is the cathode electrode layer, the electrons injected from the upper electrode 600 reach the second light emitting layer EML2 via the second electron control layer ECL2.

Each of the first and second electron control layers ECL1 and ECL 2 may be divided into at least one region selected from an electron injection region, an electron transporting region, and a hole blocking region. Each of the first and second electron control layers ECL1 and ECL2 may have a single-layered structure formed of a single material, a single-layered structure formed of a plurality of materials different from each other, or a multi-layered structure including a plurality of layers formed of a plurality of materials different from each other.

For example, each of the first and second electron control layers ECL1 and ECL2 may include at least one selected from an electron injection layer corresponding to an electron injection region and an electron transporting layer corresponding to an electron transporting region, or may be a single layer having an electron injection function and an electron transporting function at the same time (e.g., by mixing a electron injection material and an electron transporting material in a single layer).

Each of the first and second electron control layers ECL1 and ECL2 may be formed of at least one selected from an electron injection material and an electron transporting material. For example, the electron transporting material may include Tris(8-hydroxyquinolinato)aluminum (Alq3), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), and/or 9,10-di(naphthalene-2-yl)anthracene (ADN), but is not limited thereto.

For example, the electron injection material may include LiF, Lithium quinolate (LiQ), $Li_2O$, BaO, NaCl, CsF, and/or Yb; metal halides such as RbCl and/or RbI; and/or materials in which the electron transporting material and an insulating organo metal salt are mixed, but is not limited thereto.

The organo metal salt may be a material having an energy band gap of about 4 eV or more. For example, the organo metal salt may include metal acetate, metal benzoate, metal acetoacetate, metal acetylacetonate, and/or metal stearate.

Each of the first and second electron control layers ECL1 and ECL2 may be formed by using various methods such as a vacuum deposition method, a spin coating method, a casting method, a Langmuir-Blodgett (LB) method, an inject printing method, a laser printing method, and/or a laser induced thermal imaging (LITI) method.

The first sub pixel SPX1 according to an embodiment of the inventive concept is not limited thereto and thus may variously change. For example, the first sub pixel SPX1 may include three light emitting units and two charge generation layers respectively disposed between the three light emitting units.

Although the first sub pixel SPX1 has been described above, each of the second to fourth sub pixels SPX2 to SPX4 may have a structure similar to the first sub pixel SPX1.

FIGS. 17A to 17D are cross-sectional views illustrating active tasks (acts) in a method for manufacturing the display panel according to an embodiment of the inventive concept.

Figure 17A:
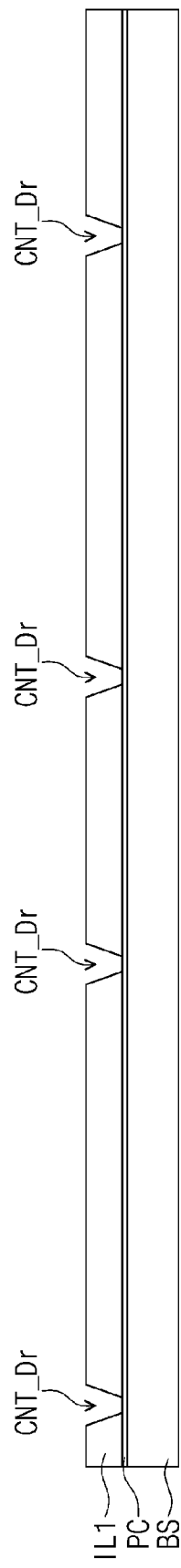
FIGS. 17A to 17D are cross-sectional views of tasks of a method for manufacturing a display panel according to an embodiment of the inventive concept.

Referring to FIG. 17A, the pixel circuit layer PC may be formed on the base substrate BS, and the first insulation layer IL1 may be formed on the pixel circuit layer PC. A plurality of driving contact holes CNT_Dr may be formed in the first insulation layer IL1. A portion of the pixel circuit layer PC may be exposed by each of the driving contact holes CNT_Dr.

Figure 17B:
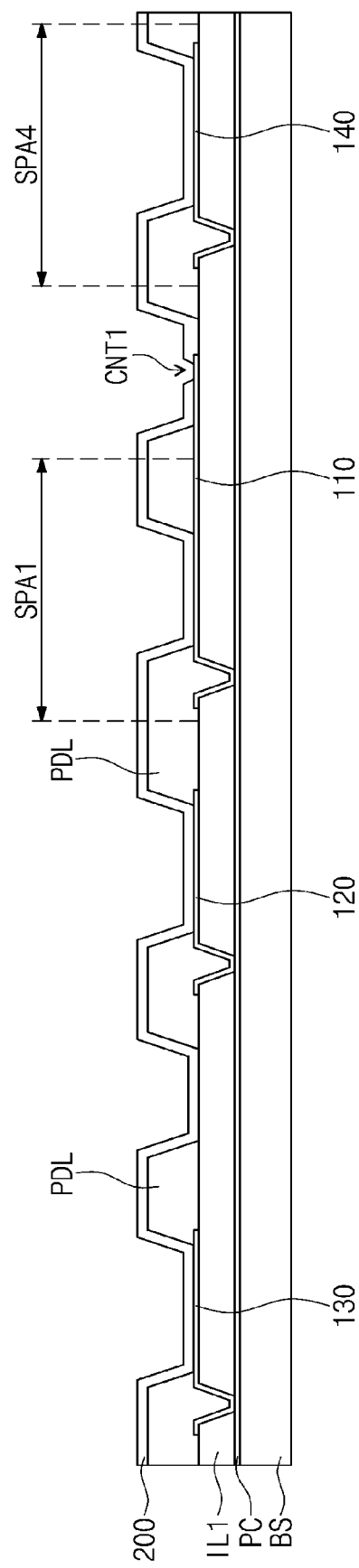

As illustrated in FIG. 17B, the first to fourth sub pixel electrodes 110, 120, 130, and 140 may be formed on the first insulation layer IL1. As described above, one end of each of the first to fourth sub pixel electrodes 110, 120, 130, and 140 may be disposed in a corresponding driving contact hole of the driving contact holes CNT_Dr, and each of the first to fourth sub pixel electrodes 110, 120, 130, and 140 may be connected (e.g., coupled) to the pixel circuit layer PC through the corresponding driving contact hole.

The pixel defining layer PDL may be formed on the first to fourth sub pixel electrodes 110, 120, 130, and 140. The pixel defining layer PDL may cover a portion of each of the first to fourth sub pixel electrodes 110, 120, 130, and 140. Thereafter, the first light emitting unit 200 may be formed on the pixel defining layer PDL and the first to fourth sub pixel electrodes 110, 120, 130, and 140.

The first contact hole CNT1 may be formed in the first light emitting unit 200, between the first sub pixel area SPA1 and the fourth sub pixel area SPA4. The first contact hole CNT1 may be formed by removing a portion of the first light emitting unit 200 disposed on the first sub pixel electrode 110 to expose a portion of the first sub pixel electrode 110. In an embodiment of the inventive concept, the layer portions to be removed may be removed through laser drilling.

Figure 17C:
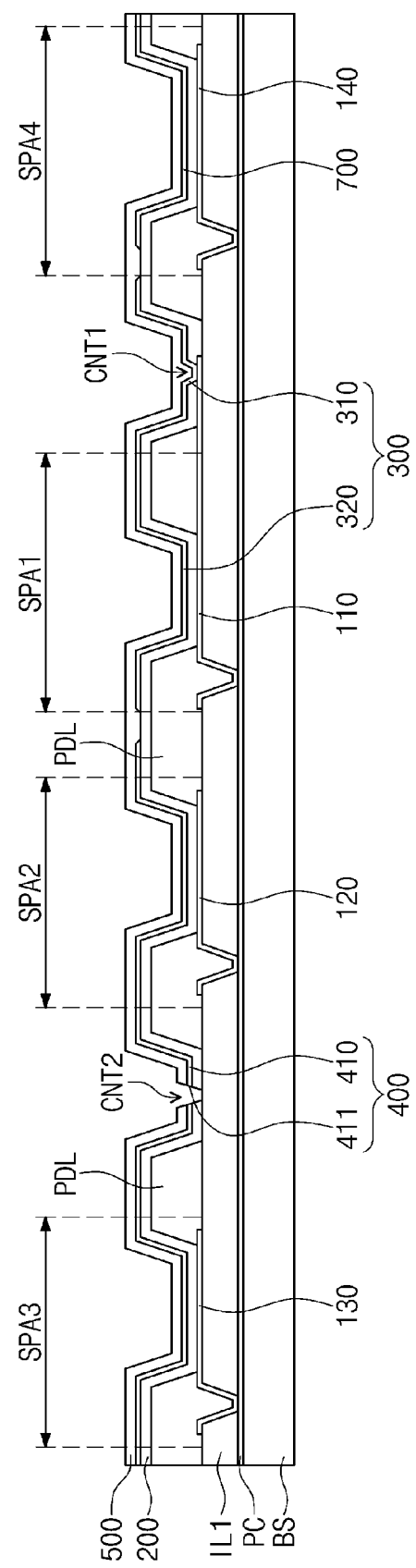

As illustrated in FIG. 17C, the first charge generation layer 300 may be formed on the first light emitting unit 200 to correspond to the first sub pixel area SPA1. The first contact part 310 of the first charge generation layer 300 may be formed in the first contact hole CNT1 to directly contact the portion of the first sub pixel electrode 110, which is exposed by the first contact hole CNT1. The first extension part 320 may horizontally extend from the first contact part 310.

The second charge generation layer 400 may be formed on the first light emitting unit 200 to correspond to the second and third sub pixel areas SPA2 and SPA3, and the third charge generation layer 700 may be formed on the first light emitting unit 200 to correspond to the fourth sub pixel area SPA4. The first to third charge generation layers 300, 400, and 700 may be insulated from each other, disposed on the same layer (e.g., on the first light emitting unit 200), and may be horizontally spaced apart from each other. The second light emitting unit 500 may be formed on the first to third charge generation layers 300, 400, and 700.

The second contact hole CNT2 may be formed between the second and third sub pixel areas SPA2 and SPA3. The second contact hole CNT2 may be formed by removing portions of the second light emitting unit 500 and the second charge generation layer 400 to expose an inclined surface 411 of the second contact part 410 of the second charge generation layer 400. In an embodiment of the inventive concept, the layer portions to be removed may be removed through laser drilling.

Figure 17D:
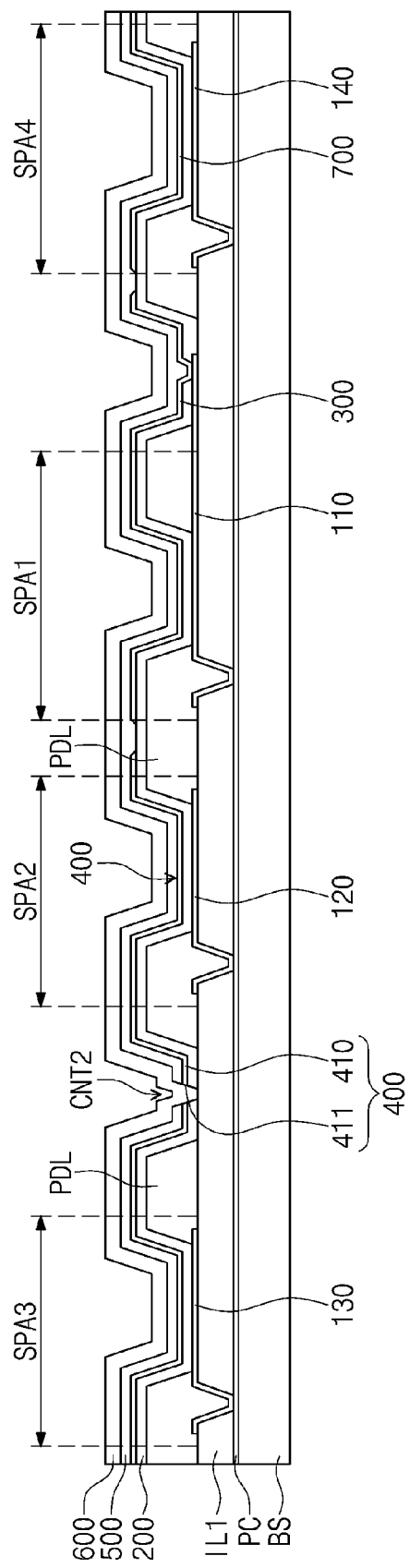

As illustrated in FIG. 17D, the upper electrode 600 may be formed on the second light emitting unit 500. A portion of the upper electrode 600 may be disposed in the second contact hole CNT2 to directly contact the inclined surface 411 of the second contact part 410, which is exposed by the second contact hole CNT2.

As described above, the first charge generation layer may receive the first pixel voltage from the first sub pixel electrode, and the second charge generation layer may receive an upper voltage from the upper electrode. As a result, the second light emitting unit may generate light by the first electric field generated between the first charge generation layer and the upper electrode, and the first light emitting unit may generate light by the second electric field generated between the second charge generation layer and the second sub pixel electrode. Thus, the driving voltage for driving the first and second light emitting units may be reduced to improve the efficiency of the first and second light emitting units.

It will be understood by those skilled in the art that example embodiments described herein should be considered in a descriptive sense only and not for purposes of limitation, and various modifications and variations can be made in the present invention. While one or more example embodiments have been described with reference to the drawings, it will be understood by those of ordinary skill in the art that various changes in form and details may be made therein without departing from the spirit and scope of the present disclosure as defined by the following claims and equivalents thereof.

What is claimed is:

1. A display panel comprising:
a base substrate;
a first sub pixel electrode on the base substrate;
a second sub pixel electrode on the base substrate and spaced apart from the first sub pixel electrode when viewed in plane;
a first light emitting unit on the first and second sub pixel electrodes, the first light emitting unit being provided with a first contact hole;
a first charge generation layer comprising a first contact part and a first extension part extending from the first contact part, the first contact part being in the first contact hole and being coupled to a portion of the first sub pixel electrode exposed by the first contact hole, and the first extension part being on the first light emitting unit;
a second charge generation layer on the first light emitting unit and overlapping the second sub pixel electrode when viewed in plane, the second charge generation layer being insulated from the first charge generation layer;
a second light emitting unit on the first and second charge generation layers, the second light emitting unit and the second charge generation layer together being provided with a second contact hole; and
an upper electrode comprising a first upper electrode part and a second upper electrode part extending from the first upper electrode part, the first upper electrode part being in the second contact hole and being coupled to a second contact part of the second charge generation layer exposed by the second contact hole, and the second upper electrode part being on the second light emitting unit.

2. The display panel of claim 1, wherein, when viewed in plane, the first and second charge generation layers are spaced apart from each other.

3. The display panel of claim 1, wherein, when viewed in a cross-section, the first and second charge generation layers are on the same layer.

4. The display panel of claim 1, wherein, when viewed in plane, the first extension part overlaps the second upper electrode part.

5. The display panel of claim 4, further comprising a pixel defining layer configured to cover a portion of the first sub pixel electrode,
wherein at least a portion of the first extension part is on the pixel defining layer.

6. The display panel of claim 4, wherein the first contact part is directly coupled to a portion of the first sub pixel electrode.

7. The display panel of claim 4, wherein the second light emitting unit between the first extension part and the second upper electrode part is configured to generate an electric field, and the second light emitting unit is configured to generate light after being excited by the electric field,
wherein the first extension part is configured to have substantially the same potential as the first sub pixel electrode.

8. The display panel of claim 1, wherein the second charge generation layer further comprises a second extension part extending from the second contact part to overlap the second sub pixel electrode when viewed in plane.

9. The display panel of claim 8, wherein, when viewed in plane, the second upper electrode part overlaps the second extension part.

10. The display panel of claim 8, further comprising a pixel defining layer configured to cover a portion of the second sub pixel electrode,
wherein at least a portion of the second extension part is on the pixel defining layer.

11. The display panel of claim 8, wherein an inclined surface of the second contact part exposed by the second contact hole is directly coupled to the first upper electrode part.

12. The display panel of claim 8, wherein the first light emitting unit between the second extension part and the second sub pixel electrode is configured to generate an electric field, and the first light emitting unit is configured to generate light after being excited by the electric field,
wherein the second upper electrode part is configured to have substantially the same potential as the second extension part.

13. The display panel of claim 8, further comprising a third sub pixel electrode spaced apart from the first and second sub pixel electrodes when viewed in plane,
wherein the second charge generation layer further comprises a third extension part extending from the second contact part to overlap the third sub pixel electrode when viewed in plane.

14. The display panel of claim 1, further comprising first and second color filters respectively configured to transmit light having colors different from each other,
wherein, when viewed in plane, the first color filter overlaps the first sub pixel electrode, and when viewed in plane, the second color filter overlaps the second sub pixel electrode.

15. The display panel of claim 13, further comprising an auxiliary line between the second contact part and the base substrate,
wherein the first upper electrode part is coupled to the auxiliary line through the second contact hole.

16. The display panel of claim 13, further comprising a fourth sub pixel electrode spaced apart from the first to third sub pixel electrodes when viewed in plane and a third charge generation layer overlapping the fourth sub pixel electrode when viewed in plane,
wherein the third charge generation layer is insulated from the first and second charge generation layers and is between the first and second light emitting units.

17. The display panel of claim 1, wherein at least one of the first and second charge generation layers comprises one or more inorganic materials selected from Ag, Mg, Yb, Al, Ca, Li, and Cs.

18. A method for manufacturing a display panel, the method comprising:
providing a first sub pixel electrode on a base substrate;
providing a second sub pixel electrode on the base substrate and spaced apart from the first sub pixel electrode when viewed in plane;
providing first light emitting unit on the first and second sub pixel electrodes;
providing a first contact hole in the first light emitting unit to expose the first sub pixel electrode;
providing a first charge generation layer on the first light emitting unit and the first sub pixel electrode and coupling the first sub pixel electrode to the first charge generation layer through the first contact hole;
providing a second charge generation layer on the first light emitting unit and spaced apart from the first charge generation layer when viewed in plane;
providing a second light emitting unit on the first and second charge generation layers;
providing a second contact hole in the second light emitting unit and the second charge generation layer; and
providing an upper electrode in the second contact hole and on the second light emitting unit and coupling a portion of the second charge generation layer exposed by the second contact hole to the upper electrode through the second contact hole.

19. The method of claim 18, further comprising providing a third sub pixel electrode on the base substrate,
wherein the third sub pixel electrode is spaced apart from the first and second sub pixel electrodes when viewed in plane.

20. The method of claim 19, further comprising:
providing a fourth sub pixel electrode on the base substrate; and
providing a third charge generation layer overlapping the fourth sub pixel electrode,
wherein the fourth sub pixel electrode is spaced apart from the first to third sub pixel electrodes when viewed in plane, and
the third charge generation layer is insulated from the first and second charge generation layers and is between the first and second light emitting units.

21. The display panel of claim 7, wherein when the electric field is generated in the second light emitting unit, the electric field is not substantially generated in the first light emitting unit.

22. The display panel of claim 12, wherein when the electric field is generated in the first light emitting unit, the electric field is not substantially generated in the second light emitting unit.

23. The display panel of claim 13, wherein the display panel further comprises a pixel circuit layer on the base substrate and a first insulation layer on the pixel circuit layer, and
wherein the third sub pixel electrode is coupled to the pixel circuit layer through a contact hole provided in the first insulation layer.

24. The display panel of claim 15, wherein the auxiliary line and the second contact hole are between the second and third sub pixel electrodes, or the auxiliary line and the second contact hole are between the third sub pixel electrode and an edge of the display panel.

25. The display panel of claim 1, wherein the first charge generation layer comprises a lower charge generation layer and an upper charge generation layer,
wherein at least one of the lower and upper charge generation layers is an N-type charge generation layer, and the other one of the lower and upper charge generation layers is a P-type charge generation layer.

26. The display panel of claim 1, wherein the first and second charge generation layers are configured to supply electrons and/or holes to the second and first light emitting units, respectively.

\* \* \* \* \*